US011627690B2

(12) United States Patent
Jo et al.

(10) Patent No.: US 11,627,690 B2
(45) Date of Patent: Apr. 11, 2023

(54) DISPLAY DEVICE AND METHOD OF MANUFACTURING SAME

(71) Applicant: LG Display Co., Ltd., Seoul (KR)

(72) Inventors: Yongsun Jo, Paju-si (KR); Deuksoo Jung, Paju-si (KR); Sikyu Lee, Paju-si (KR); Jinuk Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 147 days.

(21) Appl. No.: 17/128,892

(22) Filed: Dec. 21, 2020

(65) Prior Publication Data
US 2021/0202589 A1 Jul. 1, 2021

(30) Foreign Application Priority Data

Dec. 31, 2019 (KR) .................. 10-2019-0179733
Dec. 31, 2019 (KR) .................. 10-2019-0179734

(51) Int. Cl.
*H10K 59/38* (2023.01)
(52) U.S. Cl.
CPC ........... *H10K 59/38* (2023.02); *H10K 50/813* (2023.02); *H10K 50/822* (2023.02); *H10K 50/844* (2023.02); *H10K 50/865* (2023.02); *H10K 59/124* (2023.02); *H10K 59/1216* (2023.02); *H10K 71/00* (2023.02)
(58) Field of Classification Search
CPC ............... H01L 27/322; H01L 27/3258; H01L 27/3265; H01L 51/5209; H01L 51/5225; H01L 51/5253; H01L 51/5284; H01L 51/56; H01L 27/3248; H01L 27/3276; H01L 27/3272; H01L 2251/568; H01L 27/3213; H01L 27/3244; H01L 2227/323
See application file for complete search history.

(56) References Cited

U.S. PATENT DOCUMENTS

| 2020/0152705 | A1* | 5/2020 | Son | H01L 51/5275 |
| 2020/0161579 | A1* | 5/2020 | Kim | H01L 51/5271 |
| 2020/0168668 | A1* | 5/2020 | Kim | H01L 51/5271 |
| 2020/0258946 | A1* | 8/2020 | Kim | H01L 51/5253 |
| 2020/0274089 | A1* | 8/2020 | Son | H01L 51/524 |
| 2021/0043873 | A1* | 2/2021 | Sung | H01L 51/5253 |
| 2022/0085334 | A1* | 3/2022 | Oh | H01L 51/5275 |

FOREIGN PATENT DOCUMENTS

| KR | 10-1888060 B1 | 8/2018 |
| KR | 10-2019-0038320 A | 4/2019 |
| KR | 10-2019-0070768 A | 6/2019 |

* cited by examiner

Primary Examiner — Kevin Quarterman
(74) Attorney, Agent, or Firm — Fenwick & West LLP

(57) ABSTRACT

A display device includes: a substrate on which a first pixel displaying a first color and a second pixel displaying a second color are placed; a circuit element layer formed on the substrate and in which circuit elements are placed; a passivation layer placed on the circuit element layer; an overcoat layer on the passivation layer; a light absorption layer formed between the passivation layer and the overcoat layer in a non-emission area, and containing a colorant; an anode electrode of a light-emitting element formed in an emission area of the first pixel and an emission area of the second pixel; an emission layer of the light-emitting element covering the anode electrode; and a cathode electrode of the light-emitting element formed on the emission layer, wherein the overcoat layer is formed in an area except the emission area of the first pixel, and the first color is a white color.

20 Claims, 20 Drawing Sheets

DISPLAY DEVICE AND METHOD OF MANUFACTURING SAME

CROSS REFERENCE TO RELATED APPLICATION

The present application claims priority to Republic of Korea Patent Application No. 10-2019-0179733 filed Dec. 31, 2019, and Republic of Korea Patent Application No. 10-2019-0179734 filed Dec. 31, 2019, each of which is incorporated by reference in its entirety.

BACKGROUND

Field of Technology

The present disclosure relates to a display device and a method of manufacturing the same.

Description of the Related Art

Organic light-emitting elements (hereinafter, referred to as light-emitting elements) constituting an organic light-emitting diode display are self-luminous and do not require a separate light source, so that the thickness and the weight of the display device are reduced. In addition, the organic light-emitting diode display has high quality characteristics, such as low power consumption, high luminance, and a high response rate.

In general, a light-emitting element has a structure in which the following are stacked: an anode electrode, a bank surrounding an edge area of the anode electrode, an emission layer formed on the anode electrode at the inside of the bank, and a cathode electrode covering the emission layer and the bank. The amount of current flowing to the light-emitting element is controlled by a driving transistor, so that the light-emitting element emits light at a required luminance.

The foregoing is intended merely to aid in the understanding of the background of the present disclosure, and is not intended to mean that the present disclosure falls within the purview of the related art that is already known to those skilled in the art.

SUMMARY

Embodiments are directed to providing a display device having a bankless structure in which a bank of an organic light-emitting element is omitted so as to reduce a process step and manufacturing cost.

Embodiments are directed to providing a display device having a bankless structure, wherein a bend of a cathode electrode is formed by removing an overcoat layer in an emission area of a white pixel, and light emitted from a light-emitting element of a nearby pixel to a non-emission area is thus blocked through the white pixel.

Embodiments are directed to providing a display device having a bankless structure, wherein an active layer and an anode electrode of a light-emitting element constitute a storage capacitor.

Embodiments are directed to providing a display device having a bankless structure, the display device preventing a light-emitting element in a non-emission area from emitting light, and reducing a short circuit between an anode electrode and a cathode electrode of the light-emitting element.

Embodiments are directed to providing a display device having a bankless structure, the display device including a repair pattern so as to repair a pixel without damaging a light-emitting element.

According to an embodiment, there is provided a display device including: a substrate on which a first pixel displaying a first color and a second pixel displaying a second color are placed, the second pixel being placed near the first pixel; a circuit element layer formed on the substrate and in which circuit elements are placed; a passivation layer placed on the circuit element layer; an overcoat layer formed on the passivation layer; a light absorption layer formed between the passivation layer and the overcoat layer in a non-emission area, and containing a colorant; an anode electrode of a light-emitting element formed in an emission area of the first pixel and an emission area of the second pixel; an emission layer of the light-emitting element covering the anode electrode; and a cathode electrode of the light-emitting element formed on the emission layer, wherein the overcoat layer is formed in an area except the emission area of the first pixel, and the first color is a white color.

The display device may further include: a color filter formed on the passivation layer in the emission area of the second pixel.

The overcoat layer may have a difference in level at an edge of the emission area of the first pixel.

The emission layer and the cathode electrode may have a bending shape along the difference in level of the overcoat layer.

The cathode electrode may control a path of light emitted from the light-emitting element of the second pixel by using the bending shape.

The circuit element layer may include: a first conductive layer formed on the substrate, and including a data line placed in the non-emission area, wherein the light that reflects off the cathode electrode may be blocked from being emitted outside the display device by the first conductive layer in the non-emission area.

Each of the first pixel and the second pixel may include: the light-emitting element; a switching transistor for applying a data voltage to a first node in response to a gate signal; a storage capacitor connected to the first node, and storing the data voltage applied to the first node; and a driving transistor controlling an amount of current applied to the light-emitting element in response to a voltage stored in the storage capacitor.

The circuit element layer may include: an active layer formed on the substrate, and including a lower electrode of the storage capacitor; a second conductive layer formed on the active layer, and including electrodes of the driving transistor and the switching transistor; and a gate insulation layer interposed between the active layer and the second conductive layer, wherein the anode electrode of the first pixel includes an extended part that overlaps the lower electrode of the storage capacitor and constitutes an upper electrode of the storage capacitor.

The upper electrode of the storage capacitor may constitute the emission area of the first pixel.

The passivation layer may be interposed between the upper electrode and the lower electrode.

According to an embodiment, there is provided a display device including: a substrate on which a pixel is placed, and including an emission area and a non-emission area; a circuit element layer placed on the substrate and in which one or more circuit elements are provided; a passivation layer placed on the circuit element layer; a light absorption layer placed on the passivation layer in the non-emission area, and containing a colorant; an overcoat layer covering the light absorption layer; an anode electrode placed on the overcoat layer; an emission layer covering the anode electrode; and a cathode electrode placed on the emission layer.

The circuit element layer may include: a first conductive layer placed on the substrate, and including a light-shielding layer and a lower electrode of a storage capacitor; a buffer layer covering the first conductive layer; an active layer placed on the buffer layer; a gate insulation layer covering the active layer; and a second conductive layer placed on the gate insulation layer, and including electrodes of at least one transistor.

The storage capacitor may further include an upper electrode placed at the second conductive layer and having at least a region covering the lower electrode.

The anode electrode may be electrically connected to the upper electrode of the storage capacitor through a first via hole.

The light absorption layer may be constructed as a single absorption layer containing a colorant in a blue color in a region surrounding the first via hole.

The display device may further include a color filter placed on the passivation layer in the emission area, and made of the same material as the light absorption layer.

The first via hole may include a passivation hole penetrating through the passivation layer, an opening formed in the light absorption layer, and an opening formed in the overcoat layer.

A side of the opening penetrating through the light absorption layer and a side of the opening formed in the overcoat layer may have a positive taper shape.

A region around the opening formed in the light absorption layer may not be covered by the overcoat layer.

A region around the passivation hole may not be covered by the light absorption layer and the overcoat layer.

According to an embodiment, there is provided a method of manufacturing a display device, the method including: forming a circuit element layer on a substrate including emission areas and non-emission areas; forming a passivation layer on the circuit element layer; forming, on the passivation layer, a color filter containing a colorant in the emission area and a light absorption layer in the non-emission area; forming an overcoat layer on the light absorption layer; forming, in the non-emission area, a first via hole penetrating through the overcoat layer, the light absorption layer, and the passivation layer; forming an anode electrode on the first via hole; forming an emission layer covering the anode electrode on the overcoat layer and the anode electrode; and forming a cathode electrode on the emission layer.

The forming of the first via hole includes: forming a passivation hole penetrating through the passivation layer; and removing the overcoat layer and the light absorption layer around the passivation hole by etching the overcoat layer and the light absorption layer.

As the overcoat layer and the light absorption layer are etched, the passivation hole may be exposed to outside.

A side of the etched overcoat layer and a side of the etched light absorption layer may have a positive taper shape.

The embodiments may be implemented as a bankless structure without a light leakage phenomenon caused by light emission of the light-emitting element in the non-emission area of the light-emitting element.

According to the embodiments, luminous efficiency can be improved by expanding an emission area of a white pixel.

In addition, according to the embodiments, by forming the single absorption layer containing the pigment in a blue color around the via hole, the problem of the short circuit between the anode electrode and the cathode electrode of the light-emitting element can be prevented.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Figure 1:
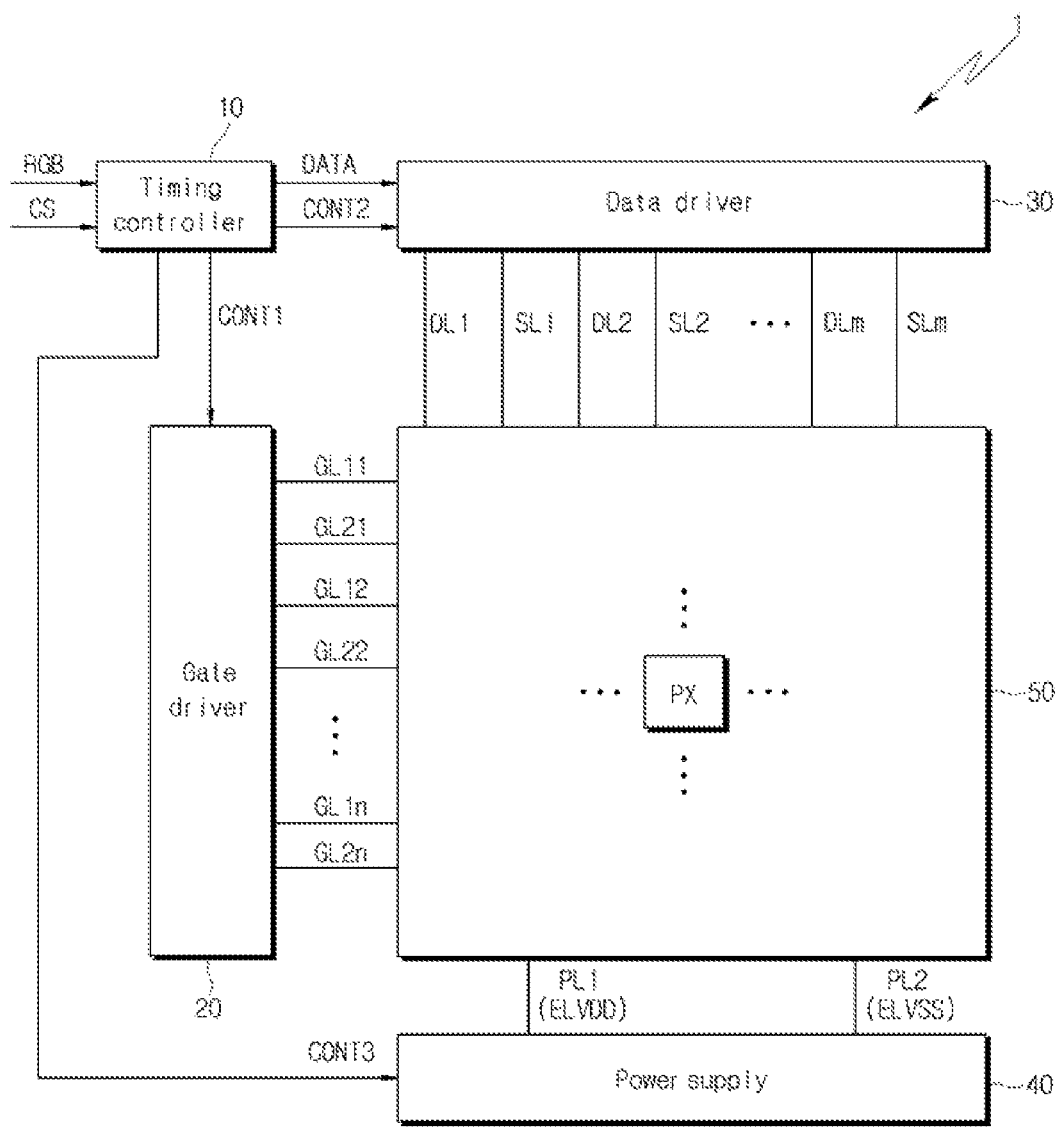
FIG. 1 is a block diagram showing a configuration of a display device according to an embodiment.

Hereinafter, embodiments will be described with reference to the accompanying drawings. In the specification, when an element (area, layer, part, or the like) is referred to as being "on", "coupled to", or "combined with" another element, it may be directly on/coupled to/combined with the other element or an intervening element may be present therebetween.

The same reference numerals refer to same elements. In the drawings, the thicknesses, ratios, and sizes of the elements are exaggerated for effective description of the technical details. The term "and/of" includes one or more combinations that the associated elements may define.

Terms "first", "second", etc. can be used to describe various elements, but the elements are not to be construed as being limited to the terms. The terms are only used to differentiate one element from other elements. For example, the "first" element may be named the "second" element without departing from the scope of the embodiments, and the "second" element may also be similarly named the "first" element. As used herein, the singular forms "a", "an", and "the" are intended to include the plural forms as well, unless the context clearly indicates otherwise.

The terms "under", "below", "on", "above", and the like are used herein for describing relationship between one or more elements shown in the drawings. These terms are relative concepts and are described on the basis of the direction in the drawings.

It is to be understood that terms such as "including", "having", etc. are intended to indicate the existence of the features, numbers, steps, actions, elements, components, or combinations thereof disclosed in the specification, and are not intended to preclude the possibility that one or more other features, numbers, steps, actions, elements, components, or combinations thereof may exist or may be added.

FIG. 1 is a block diagram showing a configuration of a display device according to an embodiment.

Referring to FIG. 1, a display device 1 includes a timing controller 10, a gate driver 20, a data driver 30, a power supply 40, and a display panel 50.

The timing controller 10 may receive an image signal RGB and a control signal CS from outside. The image signal RGB may include grayscale data. The control signal CS may include, for example, a horizontal synchronization signal, a vertical synchronization signal, and a main clock signal.

The timing controller 10 may process the image signal RGB and the control signal CS to make the signals appropriate for an operation condition of the display panel 50, so that the timing controller 10 may generate and output image data DATA, a gate driving control signal CONT1, a data driving control signal CONT2, and a power supply control signal CONT3.

The gate driver 20 may be connected to pixels (or subpixels) PXs of the display panel 50 through multiple first gate lines GL11 to GL1n. The gate driver 20 may generate gate signals on the basis of the gate driving control signal CONT1 output from the timing controller 10. The gate driver 20 may provide the generated gate signals to the pixels PXs through the multiple first gate lines GL11 to GL1n where n is a natural number.

In various embodiments, the gate driver 20 may be further connected to the pixels PXs of the display panel 50 through multiple second gate lines GL21 to GL2n where n is a natural number. The gate driver 20 may provide a sensing signal to the pixels PXs through the multiple second gate lines GL21 to GL2n. The sensing signal may be supplied so as to measure a characteristic of a driving transistor and/or a light-emitting element provided inside the pixels PXs.

The data driver 30 may be connected to the pixels PXs of the display panel 50 through multiple data lines DL1 to DLm. The data driver 30 may generate data signals on the basis of the image data DATA and the data driving control signal CONT2 output from the timing controller 10. The data driver 30 may provide the generated data signals to the pixels PXs through the multiple data lines DL1 to DLm where m is a natural number.

In various embodiments, the data driver 30 may be further connected to the pixels PXs of the display panel 50 through multiple sensing lines (or reference lines) SL1 to SLm where m is a natural number. The data driver 30 may provide a reference voltage (a sensing voltage, or an initialization voltage) to the pixels PXs through the multiple sensing lines SL1 to SLm, or may sense states of the pixels PXs on the basis of an electrical signal fed back from the pixels PXs.

The power supply 40 may be connected to the pixels PXs of the display panel 50 through multiple power lines PL1 and PL2. The power supply 40 may generate a driving voltage to be provided to the display panel 50, on the basis of the power supply control signal CONT3. The driving voltage may include, for example, a high-potential driving voltage ELVDD and a low-potential driving voltage ELVSS. The power supply 40 may provide the generated driving voltages ELVDD and ELVSS to the pixels PXs, through the corresponding power lines PL1 and PL2.

In the display panel 50, the multiple pixels PXs (or referred to as subpixels) are arranged. The pixels PXs may be, for example, arranged in a matrix form on the display panel 50.

Each of the pixels PXs may be electrically connected to the corresponding gate line and the corresponding data line. Such pixels PXs may emit light with luminance corresponding to the gate signals and the data signals that are supplied through the first gate lines GL11 to GL1n and the data lines DL1 to DLm, respectively.

Each pixel PX may display any one among a first to a third color. In an embodiment, each pixel PX may display any one among red, green, and blue colors. In another embodiment, each pixel PX may display any one among cyan, magenta, and yellow colors. In various embodiments, the pixels PXs may be configured to display any one among four or more colors. For example, each pixel PX may display any one among red, green, blue, and white colors.

The timing controller 10, the gate driver 20, the data driver 30, and the power supply 40 may be constructed as separate integrated circuits (ICs), or ICs in which at least some thereof are integrated. For example, at least one among the data driver 30 and the power supply 40 may be constructed as an integrated circuit integrated with the timing controller 10.

In addition, in FIG. 1, the gate driver 20 and the data driver 30 are shown as elements separate from the display panel 50, but at least one among the gate driver 20 and the data driver 30 may be constructed in an in-panel manner that is formed being integrated with the display panel 50. For example, the gate driver 20 may be formed being integrated with the display panel 50 according to a gate-in-panel (GIP) manner.

Figure 2:
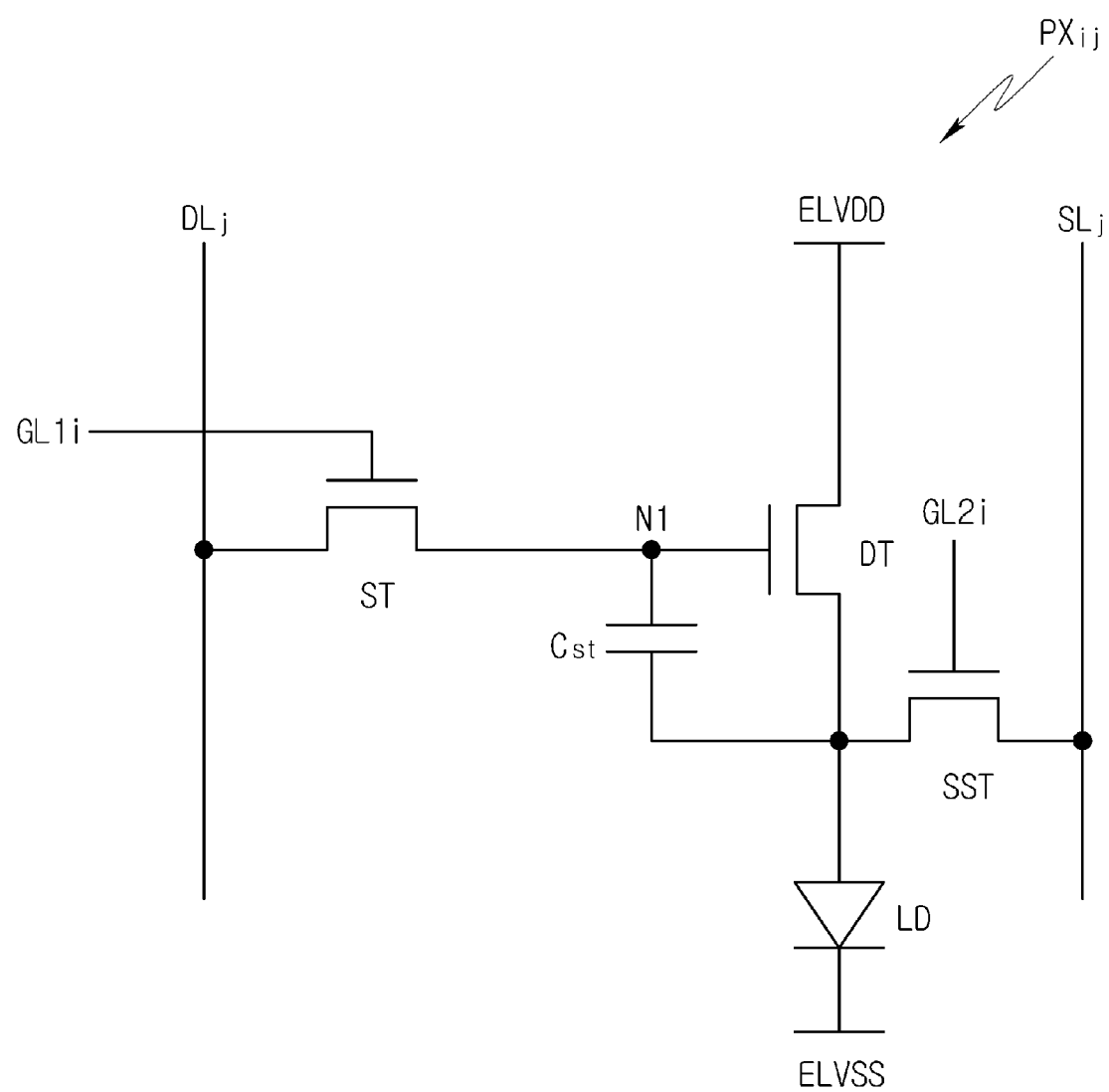
FIG. 2 is a circuit diagram showing an embodiment of a pixel shown in FIG. 1 according to an embodiment.

FIG. 2 is a circuit diagram showing an embodiment of the pixel shown in FIG. 1 according to one embodiment. FIG. 2 shows, as an example, a pixel PXij that is connected to an i-th first gate line GL1i and a j-th data line DLj.

Referring to FIG. 2, a pixel PX includes a switching transistor ST, a driving transistor DT, a sensing transistor SST, a storage capacitor Cst, and a light-emitting element LD.

A first electrode (for example, a source electrode) of the switching transistor ST is electrically connected to the j-th data line DLj, and a second electrode (for example, a drain electrode) of the switching transistor ST is electrically connected to a first node N1. A gate electrode of the switching transistor ST is electrically connected to the i-th first gate line GL1i. The switching transistor ST is turned on when a gate signal at a gate-on level is applied through the i-th first gate line GL1i, and transmits a data signal applied through the j-th data line DLj, to the first node N1.

A first electrode of the storage capacitor Cst is electrically connected to the first node N1, and a second electrode of the storage capacitor Cst receives a high-potential driving voltage ELVDD. The storage capacitor Cst may be charged with a voltage corresponding to the difference between a voltage applied to the first node N1 and the high-potential driving voltage ELVDD.

A first electrode (for example, a source electrode) of the driving transistor DT receives the high-potential driving voltage ELVDD, and a second electrode (for example, a drain electrode) of the driving transistor DT is electrically connected to a first electrode (for example, an anode electrode) of the light-emitting element LD. A gate electrode of the driving transistor DT is electrically connected to the first node N1. The driving transistor DT is turned on when a voltage at a gate-on level is applied through the first node N1, and may control the amount of a driving current flowing to the light-emitting element LD depending on a voltage provided to the gate electrode, that is, a voltage stored in the storage capacitor Cst.

A first electrode (for example, a source electrode) of the sensing transistor SST is electrically connected to a j-th sensing line SLj, and a second electrode (for example, a drain electrode) of the sensing transistor SST is electrically connected to the first electrode (for example, the anode electrode) of the light-emitting element LD. A gate electrode of the sensing transistor SST is electrically connected to an i-th second gate line GL2i. The sensing transistor SST is turned on when a sensing signal at a gate-on level is applied through the i-th second gate line GL2i, and transmits a reference voltage applied through the j-th sensing line SLj, to the anode electrode of the light-emitting element LD.

The light-emitting element LD outputs light corresponding to the driving current. The light-emitting element LD may output light corresponding to any one among red, green, and blue colors. The light-emitting element LD may be an organic light-emitting diode (OLED) or an ultra-small inorganic light-emitting diode having a size in a micro to nanoscale range, but the present disclosure is not limited thereto. Hereinafter, embodiments in which the light-emitting element LD is an organic light-emitting diode will be described.

In the present disclosure, the structure of the pixels PXs is not limited to that shown in FIG. 2. According to an embodiment, the pixels PXs may further include at least one element for compensating for a threshold voltage of the driving transistor DT, or initializing a voltage of the gate electrode of the driving transistor DT and/or a voltage of the anode electrode of the light-emitting element LD.

FIG. 2 shows an example in which the switching transistor ST, the driving transistor, and the sensing transistor SST are NMOS transistors, but the present disclosure is not limited thereto. For example, at least some or all of the transistors constituting each pixel PX may be PMOS transistors. In various embodiments, each of the switching transistor ST, the driving transistor DT, and the sensing transistor SST may be implemented as a low-temperature polycrystalline silicon (LTPS) thin-film transistor, an oxide thin-film transistor, or a low-temperature polycrystalline oxide (LTPO) thin-film transistor.

Figure 3A:
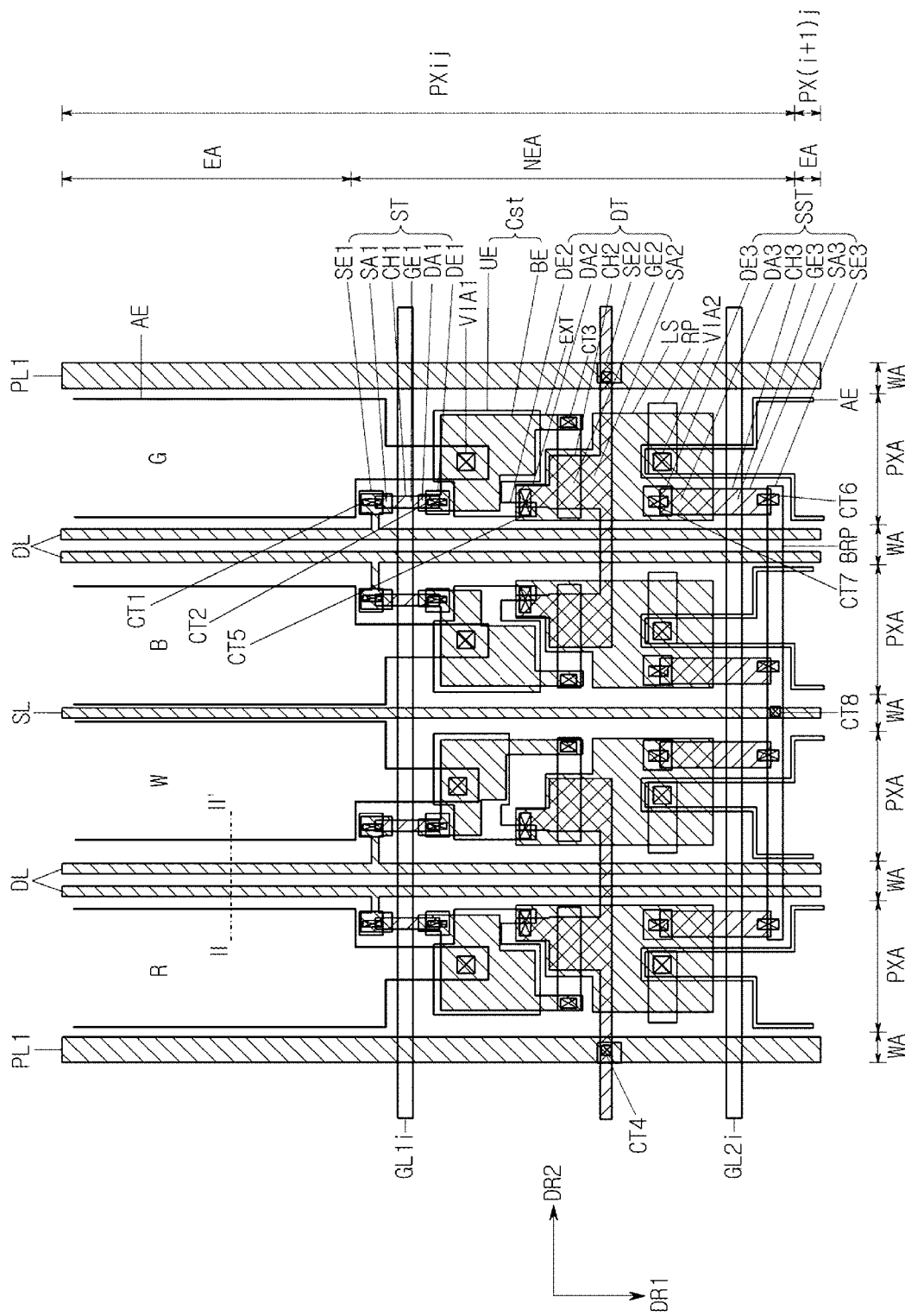
FIGS. 3A and 3B are diagrams showing a plane layout of a pixel according to an embodiment.
Figure 3B:
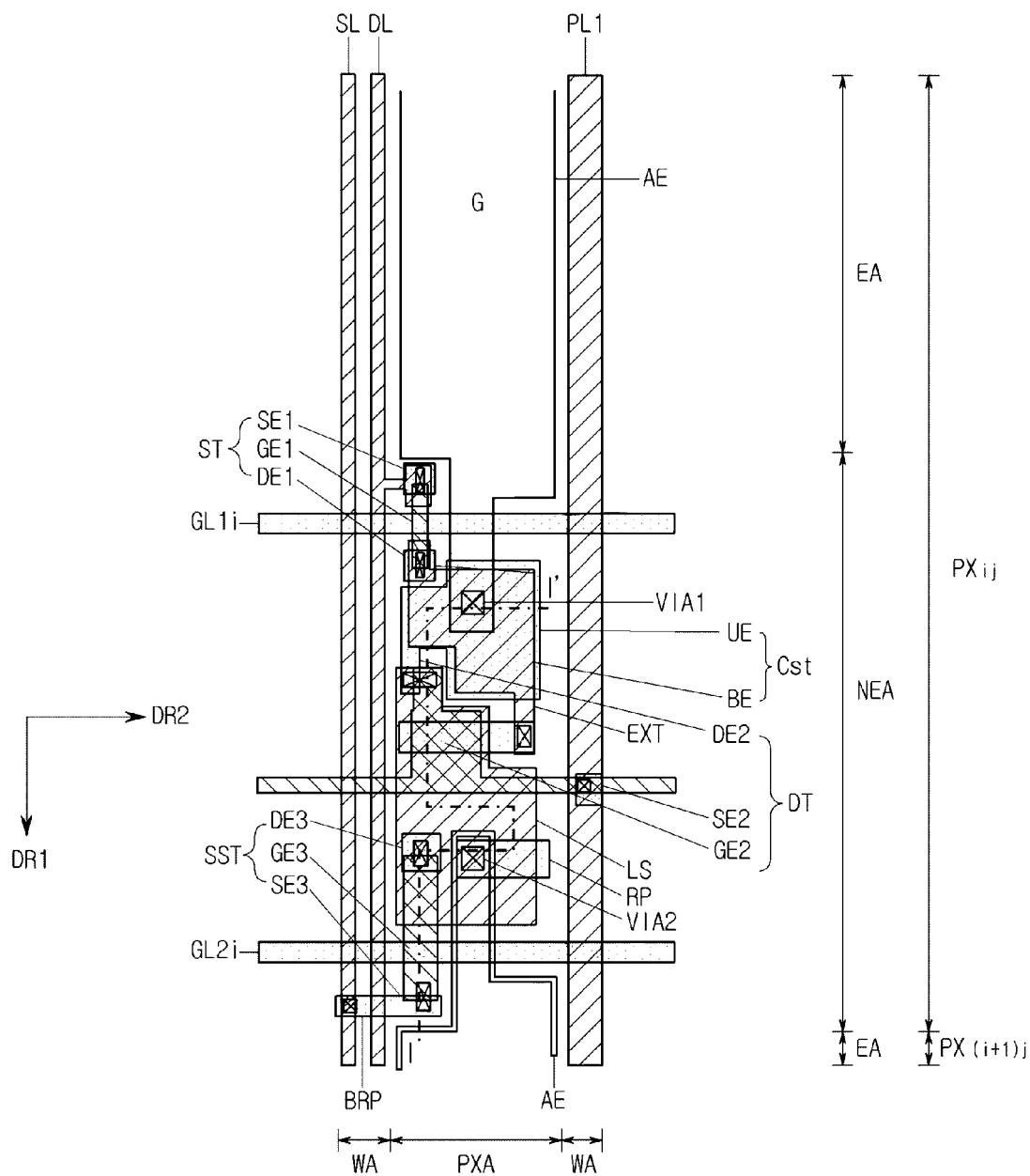

FIGS. 3A and 3B are diagrams showing a plane layout of a pixel according to an embodiment.

Referring to FIGS. 2, 3A and 3B together, the display panel 50 includes pixel areas PXAs defined at intersection regions of the data lines DLs, which extend in a first direction (for example, a pixel column direction (DR1)), and the first and the second gate lines GL1s and GL2s, which extend in a second direction (for example, a pixel row direction (DR2)). The pixels PXs are arranged in the respective pixel areas PXAs.

Each of the pixel areas PXA may include an emission area EA, and a non-emission area NEA. In the emission area EA, the light-emitting element LD of the pixel PX is placed. In the non-emission area NEA, circuit elements (for example, a switching transistor ST, a driving transistor DT, a sensing transistor SST, and a storage capacitor Cst) for driving the light-emitting element LD are placed. The light-emitting element LD is driven by the circuit elements placed in the non-emission area NEA and emits light in a particular color.

Wire areas WAs may be defined between pixel columns. In each of the wire areas WAs, the data line DL and the sensing line SL that extend in the first direction DR1 are placed. The data line DL may receive a data signal from the data driver 30. The sensing line SL may receive a reference voltage from the data driver 30, or may transmit an electrical signal output from the corresponding pixel PX, to the data driver 30.

In an embodiment, in some of the wire areas WAs, a first power line PL1 for applying the high-potential driving voltage ELVDD to the pixels PXs may be further formed. The first power line PL1 may extend in the first direction DR1 substantially parallel to the data line DL and the sensing line SL.

The first gate line GL1 and the second gate line GL2 extend in the second direction DR2, across the non-emission area NEA. Herein, the first gate line GL1 and the second gate line GL2 may be arranged at regular intervals along the first direction DR1.

The data line DL, the sensing line SL, the first power line PL1, the first gate line GL1, and the second gate line GL2 are electrically connected to the circuit elements through a contact hole. Specifically, the data line DL may be electrically connected to an electrode (for example, a source electrode) of the switching transistor ST, and the sensing line SL may be electrically connected to an electrode (for example, a source electrode) of the sensing transistor SST. The first gate line GL1 is electrically connected to gate electrodes of the switching transistor ST, and the second gate line GL2 is electrically connected to the gate electrode of the sensing transistor SST.

As described above with reference to FIG. 2, the pixel PX may include the switching transistor ST, the driving transistor DT, the sensing transistor SST, the storage capacitor Cst, and the light-emitting element LD.

The switching transistor ST may include a first gate electrode GE1, a first source electrode SE1, and a first drain electrode DE1.

The first gate electrode GE1 may be placed overlapping a first channel CH1 formed in an active layer ACT. The first channel CH1 may be a semiconductor pattern to which impurities are not doped within the active layer ACT. The first gate electrode GE1 may be electrically connected to the first gate line GL1. For example, the first gate electrode GE1 may be a region overlapping the first channel CH1 on the first gate line GL1.

The first source electrode SE1 may be connected to a first source area SA1 formed on a first side of the first channel CH1 in the active layer ACT. The first source electrode SE1 may be further connected to the data line DL through a first contact hole CT1.

The first drain electrode DE1 may be connected to a first drain area DA1 formed on a second side of the first channel CH1 in the active layer ACT. The first drain electrode DE1 may be electrically connected to a lower electrode BE of the storage capacitor Cst through a second contact hole CT2.

The driving transistor DT may include a second gate electrode GE2, a second source electrode SE2, and a second drain electrode DE2.

The second gate electrode GE2 may be placed overlapping a second channel CH2 formed in the active layer ACT. The second gate electrode GE2 may be electrically connected to the lower electrode BE of the storage capacitor Cst through a third contact hole CT3.

The second source electrode SE2 may be connected to a second source area SA2 formed on a first side of the second channel CH2 in the active layer ACT. The second source electrode SE2 may be electrically connected, through a fourth contact hole CT4, to the first power line PL1 through which the high-potential driving voltage ELVDD is applied.

In this embodiment, the second source electrode SE2 may be substantially constructed as a conductive pattern provided in the wire area WA.

The second drain electrode DE2 may be connected to a second drain area DA2 formed on a second side of the second channel CH2 in the active layer ACT. The second drain electrode DE2 may be electrically connected to an upper electrode UE of the storage capacitor Cst. For example, the second drain electrode DE2 may be formed being integrated with the upper electrode UE of the storage capacitor Cst, and may thus form one pattern. As described later, the upper electrode UE of the storage capacitor Cst is connected to an anode electrode AE of the light-emitting element LD through a first via hole VIA1. Therefore, passing through the upper electrode UE of the storage capacitor Cs, the second drain electrode DE2 of the driving transistor DT is electrically connected to the anode electrode AE of the light-emitting element LD.

In addition, the second drain electrode DE2 may be connected to a light-shielding layer LS through a fifth contact hole CT5. Because of this, when a defect in a pixel PX is repaired by using a repair pattern RP, which will be described later, the repair pattern RP and the light-shielding layer LS are connected through laser welding, and thus an anode electrode AE of a nearby pixel PX(i+1)j and the second drain electrode DE2 of the driving transistor DT are electrically connected.

The sensing transistor SST may include a third gate electrode GE3, a third source electrode SE3, and a third drain electrode DE3.

The third gate electrode GE3 may be placed overlapping a third channel CH3 formed in the active layer ACT. The third gate electrode GE3 may be electrically connected to the second gate line GL2. For example, the third gate electrode GE3 may be a region overlapping the third channel CH3 on the second gate line GL2.

The third source electrode SE3 may be connected to a third source area SA3 formed on a first side of the third channel CH3 in the active layer ACT. The third source electrode SE3 may be electrically connected to a bridge pattern BRP through a sixth contact hole CT6. The bridge pattern BRP is electrically connected to the sensing line SL through an eighth contact hole CT8. Therefore, passing through the bridge pattern BRP, the third source electrode SE3 may be electrically connected to the sensing line SL.

The third drain electrode DE3 may be connected to a third drain area DA3 formed on a second side of the third channel CH3 in the active layer ACT. In addition, the third drain electrode DE3 may be connected to the light-shielding layer LS through a seventh contact hole CT7. In this embodiment, the light-shielding layer LS is connected to the second drain electrode DE2 of the driving transistor DT through the fifth contact hole CT5. Therefore, passing through the light-shielding layer LS, the third drain electrode DE3 is electrically connected to the second drain electrode DE2 of the driving transistor DT.

The storage capacitor Cst may include the lower electrode BE and the upper electrode UE.

The lower electrode BE may be electrically connected to the first drain electrode DE1 of the switching transistor ST through the second contact hole CT2. In addition, the lower electrode BE may be electrically connected to the second gate electrode GE2 of the driving transistor DT through the third contact hole CT3.

In an embodiment, the lower electrode BE may include an extended part EXT for connection to the second gate electrode GE2 of the driving transistor DT. In a region of the extended part EXT, the lower electrode BE is overlapped by the second gate electrode GE2, and is electrically connected to the second gate electrode GE2 through the third contact hole CT3. The other region of the extended part EXT is placed not to be overlapped by a second conductive layer, which will be described later, and by the anode electrode AE of the light-emitting element LD. Because of this, when the second gate electrode GE2 and the anode electrode AE are electrically separated by cutting the extended part EXT with a laser beam and a defect in a pixel PX is repaired, an electrical short circuit between conductive layers and/or between the anode electrode AE and the cathode electrode CE of the light-emitting element LD is prevented.

The upper electrode UE is formed in such a manner that at least a region thereof covers the lower electrode BE. Between the upper electrode UE and the lower electrode BE, electric charges corresponding to the potential difference between the two electrodes are stored, so that the upper electrode UE and the lower electrode BE may operate as a storage capacitor Cst.

An area where the upper electrode UE and the lower electrode BE overlap may determine the capacitance of the storage capacitor Cst. Therefore, the upper electrode UE and the lower electrode BE may have an area (size) for satisfying the required capacitance of the storage capacitor Cst.

In an embodiment, in the case where a pixel PX emits light in a white color, it is important to secure an opening area of the pixel PX rather than the capacitance of the storage capacitor Cst. In this embodiment, the area of the upper electrode UE and the lower electrode BE of the pixel PX that emits light in a white color may be set smaller than that of a pixel emitting light in another color. Accordingly, the size of the opening area between the storage capacitor Cst and the driving transistor DT may be increased. In the case where the anode electrode AE of the light-emitting element LD extends to the opening areas of the non-emission area NEA, light generated by the light-emitting element LD is emitted to the outside through the extended opening area.

The upper electrode UE may be electrically connected to the second drain electrode DE2 of the driving transistor DT through the fifth contact hole CT5. In addition, the upper electrode UE may be electrically connected to the anode electrode AE of the light-emitting element LD through the first via hole VIA1.

The storage capacitor Cst as described above is connected to the second gate electrode GE2 of the driving transistor DT through the lower electrode BE. Above the driving transistor DT, the cathode electrode CE of the light-emitting element LD, which will be described later, may be formed. Herein, an electric field may be formed between the second gate electrode GE2 of the driving transistor DT and the cathode electrode CE, which may lower the charging rate of the storage capacitor Cst electrically connected to the second gate electrode GE2. In other words, a parasitic capacitor that has the second gate electrode GE2 as a first electrode and the cathode electrode CE as a second electrode may be formed. As in this embodiment, in the case where the second gate electrode GE2 is electrically connected to the lower electrode BE rather than the upper electrode UE of the storage capacitor Cst, an electrical path from the parasitic capacitor to the storage capacitor Cst is relatively longer, and thus the influence of the parasitic capacitor may be reduced. In addition, because the lower electrode BE of the storage capacitor Cst is formed on the substrate of the display panel 50, the formation of the electric field between the second gate electrode GE2 and the cathode electrode CE is prevented, thereby removing the parasitic capacitor.

The light-emitting element LD may include the anode electrode AE, the cathode electrode CE, and an emission layer EML placed between the anode electrode AE and the cathode electrode CE. In an embodiment, the anode electrode AE, the emission layer EML, and the cathode electrode CE may be placed in such a manner as to overlap each other in the emission area EA.

The anode electrode AE may be connected to the upper electrode UE of the storage capacitor Cst through the first via hole VIA1. On the anode electrode AE, the emission layer EML and the cathode electrode CE may be placed. Generally, the anode electrode AE is formed in the emission area EA. However, in order to be in contact with the upper electrode UE of the storage capacitor Cst, at least a region of the anode electrode AE may extend to the non-emission area NEA.

In an embodiment, in the case where the pixel PX displays a white color, the anode electrode AE may extend widely to the non-emission area NEA. Herein, light generated from the light-emitting element LD implemented as a bottom emission type may be emitted to the outside through the opening areas between the circuit elements placed in the non-emission area NEA.

The emission layer EML and the cathode electrode CE are formed widely in the emission area EA and the non-emission area NEA. Herein, the emission layer EML covers the anode electrode AE.

In an embodiment, the pixel PX may further include the repair pattern RP. The repair pattern RP is placed in such a manner that a region thereof is not overlapped by the anode electrode AE of a nearby pixel PX(i+1)j, but overlaps the light-shielding layer LS.

Herein, a region of the repair pattern RP except the above-described region is electrically connected to the anode electrode AE of the nearby pixel PX(i+1)j through the second via hole VIA2. In order to be electrically connected to the anode electrode AE of the nearby pixel PX(i+1)j, the repair pattern RP may be placed near the anode electrode AE of the nearby pixel PX(i+1)j within the non-emission area NEA.

Since the repair pattern RP is placed near the anode electrode AE of the nearby pixel PX(i+1)j within the non-emission area NEA, the light-shielding layer LS which is overlapped by the region of the repair pattern RP may have an area that widely extends from a portion overlapped by the driving transistor DT to the region.

Generally, the repair pattern RP as described above may be an island-shaped electrode that has a shape of a bar extending along the second direction DR2. However, the shape of the repair pattern RP is not limited thereto, and may be variously modified depending on a relative arrangement state of other elements including the light-shielding layer LS and the anode electrode AE.

FIGS. 3A and 3B show, as an example, a display device 1 having a WRGB structure including a white pixel W. However, the above-described embodiments are not applied only to the display device 1 having the WRGB structure. That is, among the above-described embodiments, various features not related to a white pixel W may be applied to display devices having an RGB structure or RGBG structure that do not include a white pixel W. In addition, among the above-described embodiments, various features related to a white pixel W may be applied to the display device 1 having the WRGB structure as well as display devices having various structures that include a white pixel W.

Hereinafter, a stacked structure (sectional structure) of the pixel PX according to an embodiment will be described in more detail with reference to the drawings.

Figure 4:
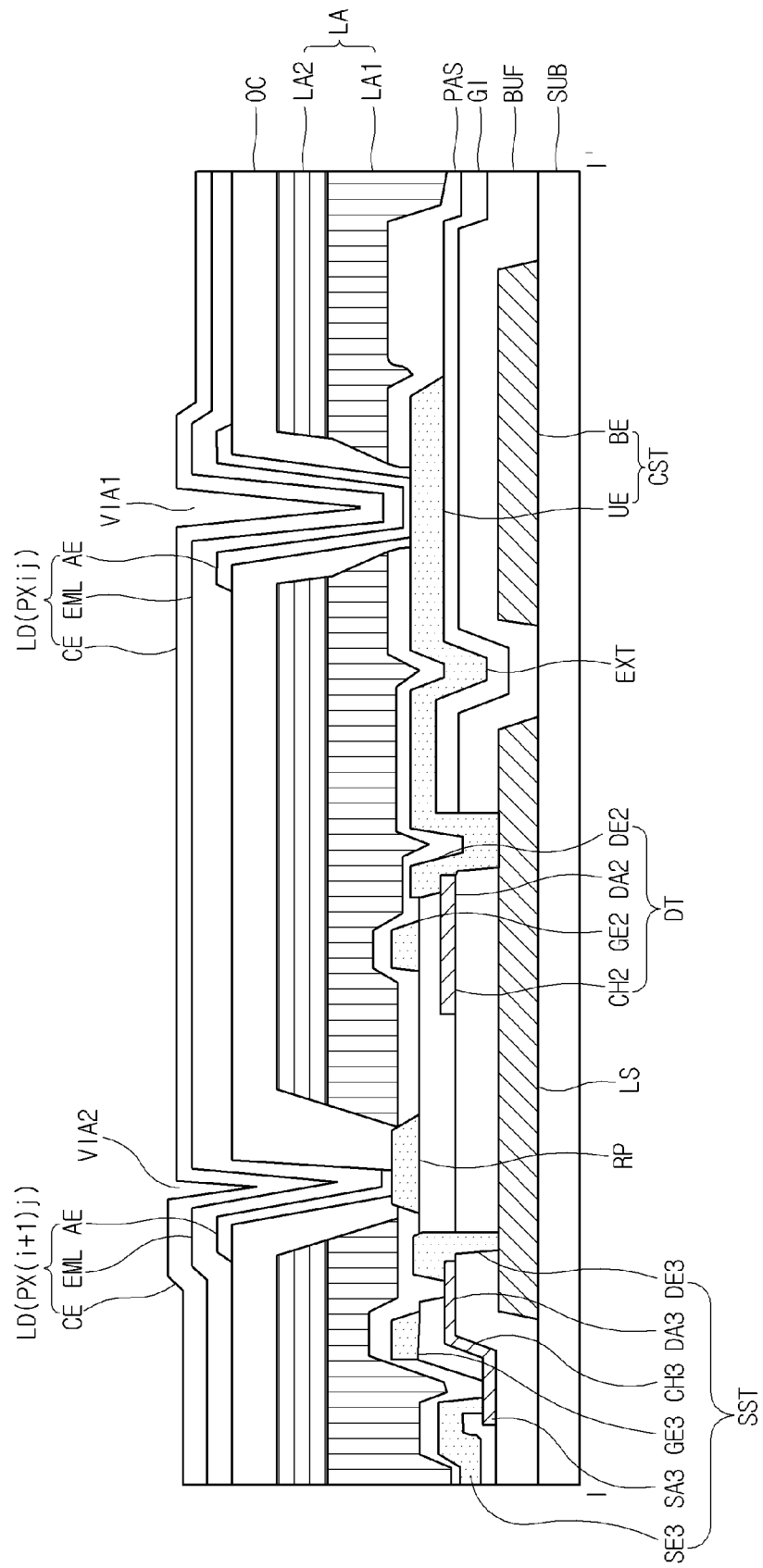
FIG. 4 is a cross-sectional view of a pixel according to an embodiment.

FIG. 4 is a cross-sectional view of a pixel according to an embodiment. Specifically, FIG. 4 is a cross-sectional view taken along line of FIG. 3B.

Referring to FIGS. 3A and 3B, and 4 together, the display panel 50 may include a substrate SUB, a circuit element layer, and a light-emitting element layer.

The substrate SUB is a base member of the display panel 50, and may be a light-transmissive substrate. The substrate SUB may be a rigid substrate including glass or tempered glass, or may be a flexible substrate made of a plastic material. For example, a substrate SUB may be made of a plastic material, such as polyimide, polyethylene terephthalate (PET), polyethylene naphthalate (PEN), polycarbonate (PC), and the like. However, the material of the substrate SUB is not limited thereto.

On the substrate SUB, a pixel area PXA is defined. The pixel area PXA may be defined as an area including at least one circuit element placed at the circuit element layer, and a light-emitting element LD placed at the light-emitting element layer. The at least one circuit element and the light-emitting element LD may constitute one pixel PX.

The circuit element layer is formed on the substrate SUB, and may include circuit elements (for example, a switching transistor ST, a driving transistor DT, a sensing transistor SST, a storage capacitor Cst, and the like) and wires constituting the pixel PX.

First, on the substrate SUB, a first conductive layer may be placed. The first conductive layer may include the light-shielding layer LS and the lower electrode BE of the storage capacitor Cst.

The light-shielding layer LS is placed in such a manner so as to be overlapped by a semiconductor pattern of the driving transistor DT, particularly, the second channel CH2 when viewed from above, and may thus protect the oxide semiconductor device from external light. In an embodiment, the light-shielding layer LS may be further connected to the second drain electrode DE2 of the driving transistor DT through the fifth contact hole CT5. Because of this, when the defect in the pixel PX is repaired by using the repair pattern RP, which will be described later, the repair pattern RP and the light-shielding layer LS are connected through laser welding, and thus an anode electrode AE of a nearby pixel PX(i+1)j and the second drain electrode DE2 of the driving transistor DT are electrically connected.

The lower electrode BE may be electrically connected to the first drain electrode DE1 of the switching transistor ST through the second contact hole CT2. In addition, the lower electrode BE may be electrically connected to the second gate electrode GE2 of the driving transistor DT through the third contact hole CT3.

In an embodiment, the lower electrode BE may include an extended part EXT for connection to the second gate electrode GE2 of the driving transistor DT. In a region of the extended part EXT, the lower electrode BE is overlapped by the second gate electrode GE2, and is electrically connected to the second gate electrode GE2 through the third contact hole CT3. The other region of the extended part EXT is placed not to be overlapped by the other electrodes of the circuit elements and the anode electrode AE of the light-emitting element LD. Because of this, when the second gate electrode GE2 and the anode electrode AE are electrically separated by cutting the extended part EXT with a laser and the defect in the pixel PX is repaired, an electrical short circuit between the other electrodes and/or between the anode electrode AE and the cathode electrode CE of the light-emitting element LD is prevented.

In the wire area WA, the first conductive layer may further include the data line DL, the sensing line SL, and the first power line PL1. The data line DLj is connected to the first source electrode SE1 of the switching transistor ST through the first contact hole CT1. Passing through the bridge pattern BRP, the sensing line SL is connected to the third source electrode SE3 of the sensing transistor SST. The first power line PL1 is connected to the second source electrode SE2 of the driving transistor DT through the fourth contact hole CT4.

In various embodiments, on the substrate SUB, wires and/or electrodes not shown, for example, the second power line PL2 through which the low-potential driving power ELVSS is applied, an auxiliary electrode, and the like may be further provided.

A buffer layer BUF is placed on the substrate SUB so as to cover the light-shielding layer LS, the lower electrode BE of the storage capacitor Cst, and the wires. The buffer layer BUF may reduce diffusion of ions or impurities from the substrate SUB, and may block moisture penetration. In addition, the buffer layer BUF may enhance the flatness of the surface of the substrate SUB. The buffer layer BUF may include an inorganic material, such as an oxide, a nitride, and the like, an organic material, or an organic-inorganic compound. The buffer layer BUF may be formed in a single-layer or multi-layer structure. For example, the buffer layer BUF may have a structure of three or more layers of silicon oxide, silicon nitride, and silicon oxide in that order. In another embodiment, the buffer layer BUF may be omitted.

The active layer ACT may be formed on the buffer layer BUF. The active layer ACT may be made of a silicon-based semiconductor material or an oxide-based semiconductor material. As the silicon-based semiconductor material, amorphous silicon or polycrystalline silicon may be used. As the oxide-based semiconductor material, a quaternary metal oxide, such as an indium tin gallium zinc oxide (InSnGaZnO); a ternary metal oxide, such as an indium gallium zinc oxide (InGaZnO), an indium tin zinc oxide (InSnZnO), an indium aluminum zinc oxide (InAlZnO), a tin gallium zinc oxide (SnGaZnO), an aluminum gallium zinc oxide (AlGaZnO), or a tin aluminum zinc oxide (SnAlZnO); or a binary metal oxide, such as an indium zinc oxide (InZnO), a tin zinc oxide (SnZnO), an aluminum zinc oxide (AlZnO), a zinc magnesium oxide (ZnMgO), a tin magnesium oxide (SnMgO), an indium magnesium oxide (InMgO), an indium gallium oxide (InGaO), an indium oxide (InO), a tin oxide (SnO), or a zinc oxide (ZnO), may be used.

The active layer ACT may include: the first to the third source area SA1 to SA3 and the first to the third drain area DA1 to DA3 containing p-type or n-type impurities; and the first to the third channel CH1 to CH3 formed between the first to the third source area SA1 to SA3 and the first to the third drain area DA1 to DA3, respectively.

The second conductive layer is placed on the active layer ACT. Between the active layer ACT and the second conductive layer, a gate insulation layer GI may be interposed. The gate insulation layer GI may be a silicon oxide (SiOx), a silicon nitride (SiNx), or multiple layers of a silicon oxide (SiOx) and a silicon nitride (SiNx).

The second conductive layer may include the gate electrodes GE1, GE2, and GE3, the source electrodes SE1, SE2, and SE3, and the drain electrodes DE1, DE2, and DE3. The gate electrodes GE1, GE2, and GE3 may be placed overlapping the corresponding channels CH1, CH2, and CH3 in the active layer ACT, respectively. At least some (GE1 and GE3) gate electrodes GE1, GE2, and GE3 are formed being integrated with the wires GL1 and GL2 electrically connected to the gate electrodes GE1 and GE3, thereby forming one pattern.

The second conductive layer may further include the upper electrode UE of the storage capacitor Cst. The upper electrode UE is formed in such a manner that at least a region thereof covers the lower electrode BE. Between the upper electrode UE and the lower electrode BE, electric charges corresponding to the potential difference between the two electrodes are stored, so that the upper electrode UE and the lower electrode BE may operate as a storage capacitor Cst.

The upper electrode UE may be electrically connected to the second drain electrode DE2 of the driving transistor DT through the fifth contact hole CT5. In addition, the upper electrode UE may be electrically connected to the anode electrode AE of the light-emitting element LD through the first via hole VIA1.

The storage capacitor Cst as described above is connected to the second gate electrode GE2 of the driving transistor DT through the lower electrode BE. Above the driving transistor DT, the cathode electrode CE of the light-emitting element LD, which will be described later, may be formed. Herein, an electric field may be formed between the second gate electrode GE2 of the driving transistor DT and the cathode electrode CE, which may lower the charging rate of the storage capacitor Cst electrically connected to the second gate electrode GE2. In other words, a parasitic capacitor that has the second gate electrode GE2 as a first electrode and the cathode electrode CE as a second electrode may be formed. As in this embodiment, in the case where the second gate electrode GE2 is electrically connected to the lower electrode BE rather than the upper electrode UE of the storage capacitor Cst, an electrical path from the parasitic capacitor to the storage capacitor Cst is relatively longer, and thus the influence of the parasitic capacitor may be reduced. In addition, because the lower electrode BE of the storage capacitor Cst is formed on the substrate of the display panel 50, the formation of the electric field between the second gate electrode GE2 and the cathode electrode CE is prevented, thereby removing the parasitic capacitor.

The second conductive layer may further include the bridge pattern BRP. The bridge pattern BRP may electrically connect the third source electrode SE3 of the sensing transistor SST and the sensing line SL.

The second conductive layer may further include the repair pattern RP. The repair pattern RP is placed in such a manner that a region thereof is not overlapped by the anode electrode AE of a nearby pixel PX(i+1)j, but overlaps the light-shielding layer LS. Herein, a region of the repair pattern RP except the above-described region is electrically connected to the anode electrode AE of the nearby pixel PX(i+1)j through the second via hole VIA2.

The first and the second conductive layer may be made of any one or an alloy of two or more selected from a group consisting of molybdenum (Mo), aluminum (Al), chromium (Cr), gold (Au), titanium (Ti), nickel (Ni), neodymium (Nd), and copper (Cu). In addition, the first and the second conductive layer may be multiple layers composed of any one or an alloy of two or more selected from a group consisting of molybdenum (Mo), aluminum (Al), chromium (Cr), gold (Au), titanium (Ti), nickel (Ni), neodymium (Nd), and copper (Cu). For example, the first and the second conductive layer may be two layers of molybdenum and aluminum-neodymium, or molybdenum and aluminum.

The circuit element layer may be covered by a passivation layer PAS. The passivation layer PAS may cover the second conductive layer, and exposed areas of the buffer layer BUF and the active layer ACT that are not covered by the second conductive layer. The passivation layer PAS may be an insulation film for protecting the lower elements, and may be a silicon oxide film (SiOx), a silicon nitride film (SiNx), or multiple layers of a silicon oxide film (SiOx) and a silicon nitride film (SiNx). In various embodiments, the passivation layer PAS may be omitted.

On the passivation layer PAS, an overcoat layer OC may be formed. The overcoat layer OC may be a planarizing film for reducing the difference in level of the lower structure, and may be composed of an organic material such as polyimide, benzocyclobutene series resin, acrylate, and the like.

In an embodiment, between the passivation layer PAS and the overcoat layer OC, a color filter (not shown) may be formed. The color filter may be formed in the emission area EA. The color filter is a wavelength-selective optical filter that selectively transmits only a partial wavelength band of incident light by transmitting light in a particular wavelength band and blocking light in other particular wavelength bands. The color filter may be made of a photosensitive resin containing a colorant, such as a pigment, a dye, or the like. In the emission area EA, light passing through the color filter may have any one among red, green, and blue colors. In the case where a pixel PX displays a white color, the color filter may be omitted for the pixel PX.

It has been described above that the color filter is formed between the passivation layer PAS and the overcoat layer OC, but this embodiment is not limited thereto. That is, in the case where the light-emitting element LD is of a top emission type, the color filter may be formed at an upper layer of a light-emitting element layer which will be described later.

The light-emitting element layer is formed on the overcoat layer OC and includes light-emitting elements LDs. The light-emitting element LD may include the anode electrode AE, the emission layer EML, and the cathode electrode CE.

At least one among the anode electrode AE and the cathode electrode CE may be a transmissive electrode and at least another may be a reflective electrode. For example, in the case where the light-emitting element LD is of a bottom emission type, the anode electrode AE may be a transmissive electrode, and the cathode electrode CE may be a reflective electrode. In contrast, in the case where the light-emitting element LD is of a top emission type, the anode electrode AE may be a reflective electrode, and the cathode electrode CE may be a transmissive electrode. In another example, in the case where the light-emitting element LD is of a dual emission type, both the anode electrode AE and the cathode electrode CE may be transmissive electrodes. Hereinafter, taking the case where the light-emitting element LD is of a bottom emission type as an example, a detailed configuration of the light-emitting element LD will be described.

The anode electrode AE is formed on the overcoat layer OC. The anode electrode AE is electrically connected to the upper electrode UE of the storage capacitor Cst through the first via hole VIA1 penetrating through the overcoat layer OC and the passivation layer PAS. Passing through the storage capacitor Cst, the anode electrode AE may be electrically connected to the second drain electrode DE2 of the driving transistor DT. As described above, when the first via hole VIA1 is formed to be in contact with the upper electrode UE of the storage capacitor Cst that has a relatively large area than other electrodes have, influence of the difference in level near the first via hole VIA1 is reduced.

The anode electrode AE may be made of a transparent conductive material, such as indium tin oxide (ITO), indium zinc oxide (IZO), zinc oxide (ZnO), or the like. In the case where the anode electrode AE is a reflective electrode, the anode electrode AE may include a reflective layer. The reflective layer may be made of aluminum (Al), copper (Cu), silver (Ag), nickel (Ni), or an alloy thereof. In an embodiment, the reflective layer may be composed of an alloy (APC) of silver, palladium, and copper.

The emission layer EML is formed on the anode electrode AE. In this embodiments, the display device 1 has a bankless form. In this embodiment, the emission layer EML is formed in such a manner as to cover the anode electrode AE. The emission layer EML may be formed widely in the emission area EA and the non-emission area NEA.

The emission layer EML may have a multi-layer thin-film structure including a light generation layer. Herein, the color of light generated by the light generation layer may be white, red, blue, green, or the like, but is not limited thereto.

The light generation layer may include, for example, a hole transport layer (HTL), an organic emission layer, and an electron transport layer (ETL). The hole transport layer smoothly transports holes injected from the anode electrode AE, to the organic emission layer. The organic emission layer may be made of an organic material including a phosphorescent or fluorescent material. The electron transport layer smoothly transports electrons injected from the cathode electrode CE, to the organic emission layer. In addition to the hole transport layer, the organic emission layer, and the electron transport layer, the emission layer (EML) may further include a hole injection layer (HIL), a hole blocking layer (HBL), an electron injection layer (EIL), and an electron blocking layer (EBL).

The emission layer EML may be formed in a tandem structure of two or more stacks. In this case, each of the stacks may include the hole transport layer, the organic emission layer, and the electron transport layer. In the case where the emission layer EML is formed in the tandem structure of two or more stacks, a charge generation layer is formed between the stacks. The charge generation layer may include an n-type charge generation layer and a p-type charge generation layer. The n-type charge generation layer is positioned near the lower stack. The p-type charge generation layer is formed on the n-type charge generation layer and is thus positioned near the upper stack. The n-type charge generation layer injects electrons into the lower stack, and the p-type charge generation layer injects holes into the upper stack. The n-type charge generation layer may be an organic layer obtained by doping, into an organic host material having electron transport capability, alkali metals, such as lithium (Li), sodium (Na), potassium (K), or cesium (Cs), or alkaline earth metals, such as magnesium (Mg), strontium (Sr), barium (Ba), or radium (Ra). The p-type charge generation layer may be an organic layer obtained by doping dopants into an organic host material having hole transport capability.

The cathode electrode CE is formed on the emission layer EML. The cathode electrode CE may be formed widely in the emission area EA and the non-emission area NEA.

The cathode electrode CE may be made of a transparent conductive material (TCO) capable of transmitting light, or a semi-transmissive conductive material, such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In the case where the cathode electrode CE is made of the semi-transmissive conductive material, light emission efficiency may be increased due to a micro cavity.

Referring to FIGS. 3A, 3B, and 4 together, in this embodiment, at least a region of the anode electrode AE extends to the non-emission area NEA in order to be in contact with the circuit element. Since the emission layer EML and the cathode electrode CE are stacked on the whole area of the anode electrode AE, undesired light emission may occur in the non-emission area NEA (a light leakage phenomenon). In the non-emission area NEA, to reduce emission of the light generated by the light-emitting element LD to the outside, in this embodiment, a light absorption layer LA formed between the passivation layer PAS and the overcoat layer OC, and in the non-emission area NEA is further included.

The light absorption layer LA may contain a colorant, such as a pigment, a dye, or the like, which selectively transmits only a partial wavelength band of incident light by transmitting light in a particular wavelength band and blocking light in other particular wavelength bands. The light absorption layer LA may have a structure in which two or more pigment layers are stacked, so as to absorb light generated by the light-emitting element LD. For example, the light absorption layer LA may include: a first absorption layer LA1 containing a pigment in a first color; and a second absorption layer LA2 containing a pigment in a second color that is different from the first color. In an embodiment, the first color may be a red color and the second color may be a blue color, but no limitation thereto is imposed. As described above, in the case where absorption layers containing pigments in different colors overlap, the light leakage phenomenon is effectively blocked by a reflective luminous effect (for example, a black-color luminous effect).

The light absorption layer LA described above is composed of the same materials as the color filter, and may be formed by the same process as the color filter. That is, the color filter and the light absorption layer LA containing the pigments in the same color may be formed together through a single masking process. For example, when the color filter containing the pigment in the first color is formed, the first absorption layer of the light absorption layer LA is formed together. When the color filter containing the pigment in the second color is formed, the second absorption layer of the light absorption layer LA is formed together. Accordingly, this embodiment makes it possible to prevent a light leakage phenomenon in the bankless structure without requiring a separate additional process for generating the light absorption layer LA.

The light absorption layer LA may be formed in the whole region of the non-emission area NEA. However, this embodiment is not limited thereto. Depending on the implementation, the light absorption layer LA may be formed on the anode electrode AE within the non-emission area NEA. In an embodiment, in the case where a pixel PX displays a white color, the light absorption layer LA may not be formed in the pixel PX.

When the light absorption layer LA is formed in the whole region of the non-emission area NEA, the first via hole VIA1 and the second via hole VIA2 are formed in such a manner as to penetrate through the light absorption layer LA. Alternatively, the light absorption layer LA may be constructed in such a manner as not to be formed around the first via hole VIA1 and the second via hole VIA2.

Figure 5:
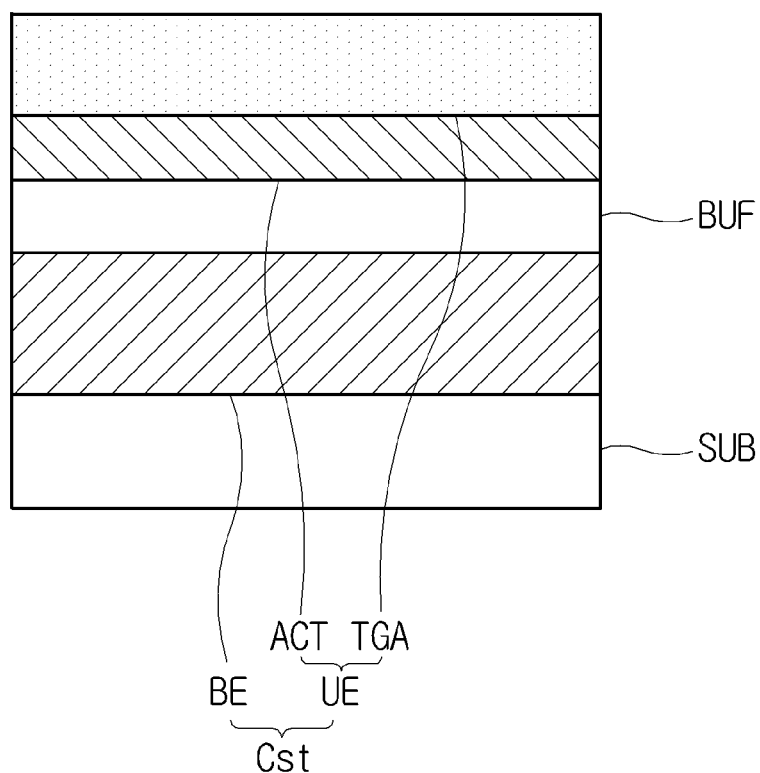
FIG. 5 is a cross-sectional view of a storage capacitor according to another embodiment.

FIG. 5 is a cross-sectional view of a storage capacitor according to another embodiment.

As described above with reference to FIGS. 3A, 3B, and 4, in an embodiment, the storage capacitor Cst may be composed of the lower electrode BE formed at the first conductive layer, and the upper electrode UE formed at the second conductive layer. Between the lower electrode BE and the upper electrode UE, the buffer layer BUF and the gate insulation layer GI are interposed.

In the case where two insulation layers are interposed between the lower electrode BE and the upper electrode UE, the distance between the electrodes BE and UE is relatively longer, resulting in a decrease in the capacitance of the storage capacitor Cst. In order to secure a desired capacitance, the areas of the lower electrode BE and the upper electrode UE need to be increased. However, when the area of the storage capacitor Cst is increased, the size of the pixel PX is increased and it is thus difficult to implement a high-resolution display device. In addition, in the case of a pixel PX displaying a white color, it is difficult to secure an aperture ratio.

In order to solve this problem, in an embodiment, the upper electrode UE of the storage capacitor Cst may have a multi-layer structure in which the active layer ACT and a second conductive layer TGA overlap. Herein, the buffer layer BUF is interposed between the lower electrode BE and the upper electrode UE.

Compared with the embodiment of FIG. 4, in the embodiment shown in FIG. 5, only one insulation layer is interposed between the lower electrode BE and the upper electrode UE of the storage capacitor Cst. Therefore, the distance between the electrodes is relatively reduced, so that the capacitance of the storage capacitor Cst may be improved. Accordingly, an increase of the area of the storage capacitor Cst is prevented, and as a result, the size of the pixel PX is reduced and the aperture ratio of the white pixel is secured.

FIGS. 6A to 6D are diagrams showing a problem of a short circuit in a light-emitting element, which may occur in a display device having a bankless structure. FIGS. 7A to 7E are diagrams showing a method of forming a first via hole according to an embodiment.

As described above, the anode electrode AE of the light-emitting element LD may be connected to the upper electrode UE of the storage capacitor Cst through the first via hole VIA1 that penetrates through the overcoat layer OC and the passivation layer PAS. The first via hole VIA1 may be formed through a photo-resist (PR) process and a wet etching process.

Figure 6A:
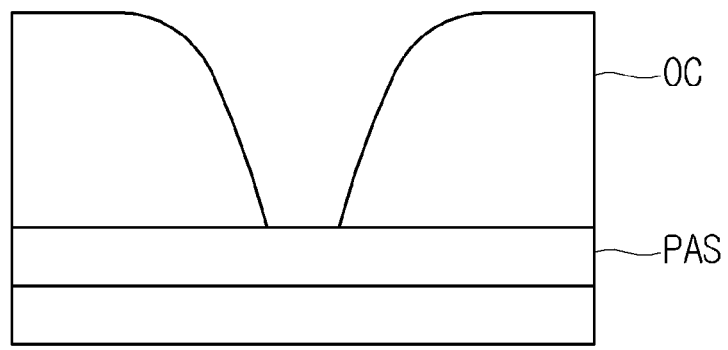
FIGS. 6A to 6D are diagrams showing a problem of a short circuit in a light-emitting element which may occur in a display device having a bankless structure.

Specifically, as shown in FIG. 6A, on the passivation layer PAS, the overcoat layer OC may be exposed and developed by using a mask (photolithography). Herein, the mask may be patterned in such a manner that the overcoat layer OC is not formed at a region corresponding to the first via hole VIA1. On the exposed passivation layer PAS on which the overcoat layer OC is not formed, the residual film of the overcoat layer OC may be removed.

Figure 6B:
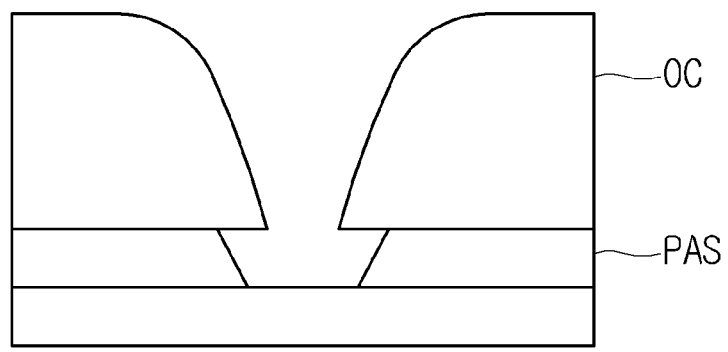

Afterward, a passivation hole may be formed at the exposed passivation layer PAS. Specifically, as shown in FIG. 6B, with a mask applied which has an opening corresponding to the first via hole VIA1, a selective etchant capable of selectively etching the passivation layer PAS is applied, thereby forming the passivation hole.

Figure 6C:
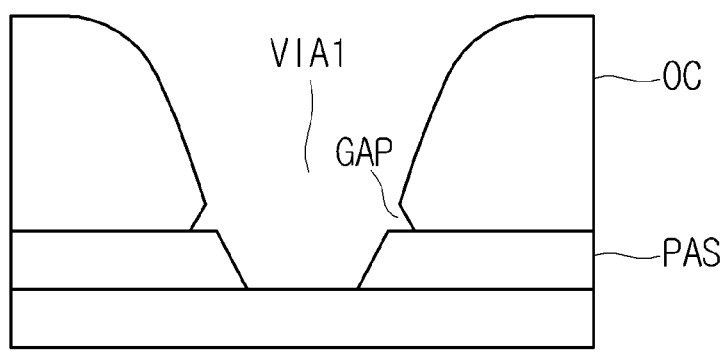

Afterward, as shown in FIG. 6C, the overcoat layer OC is etched to remove the overcoat layer OC around the passivation hole. As the overcoat layer OC is removed, the passivation hole is completely exposed to the outside, and the first via hole VIA1 penetrating through the overcoat layer OC and the passivation layer PAS is formed.

In the display device 1 having a bankless structure, the overcoat layer OC is formed in such a manner as to be thicker than that of a structure having a bank. For example, the overcoat layer OC may have a thickness of about 4.5 µm. As the overcoat layer OC becomes thick, the rate of removal of the overcoat layer OC by etching is decreased, and the overcoat layer OC thus remains at a region adjacent to the edge of the passivation hole. In addition, when the overcoat layer OC is etched, the side is excessively etched, resulting in formation of an undercut. Due to the remains of the overcoat layer OC and the undercut around the passivation hole, a gap GAP between the overcoat layer OC and the passivation layer PAS may be formed at the sidewall of the first via hole VIA1.

After the first via hole VIA1 is formed, the anode electrode AE, the emission layer EML, and the cathode electrode CE may be stacked in order on the overcoat layer OC. Herein, the anode electrode AE, the emission layer EML, and the cathode electrode CE may be stacked inside the first via hole VIA1, and may fill the inside of the gap formed at the sidewall of the first via hole VIA1.

Figure 6D:
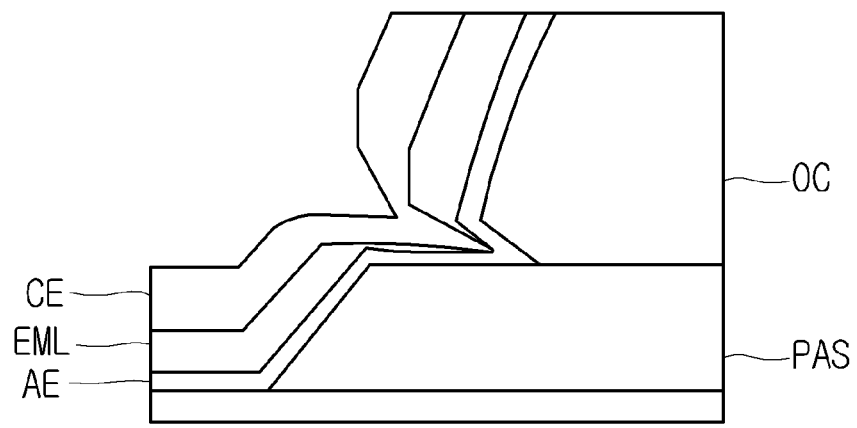

The anode electrode AE and the cathode electrode CE having relatively good step coverage characteristics may be continuously formed near the gap without being separated due to the undercut of the overcoat layer OC. However, the emission layer EML having relatively poor step coverage characteristics may be separated near the gap due to the undercut. As the emission layer EML is separated, inside the gap, the anode electrode AE and the cathode electrode CE may be electrically shorted as shown in FIG. 6D.

In order to prevent such a short-circuit error in the light-emitting element LD, in an embodiment, the first via hole VIA1 may be formed in such a manner as to penetrate through the light absorption layer LA. That is, the light absorption layer LA may be formed along the edge of the first via hole VIA1.

The light absorption layer LA is not excessively etched during the etching due to the material characteristics, and thus an undercut is not formed. The etched section has a positive taper shape. Therefore, a gap is not formed between the layers of the passivation layer PAS, the light absorption layer LA, and the overcoat layer OC, and emission layer EML and the cathode electrode CE may be continuously formed at the etched section.

Figure 7A:
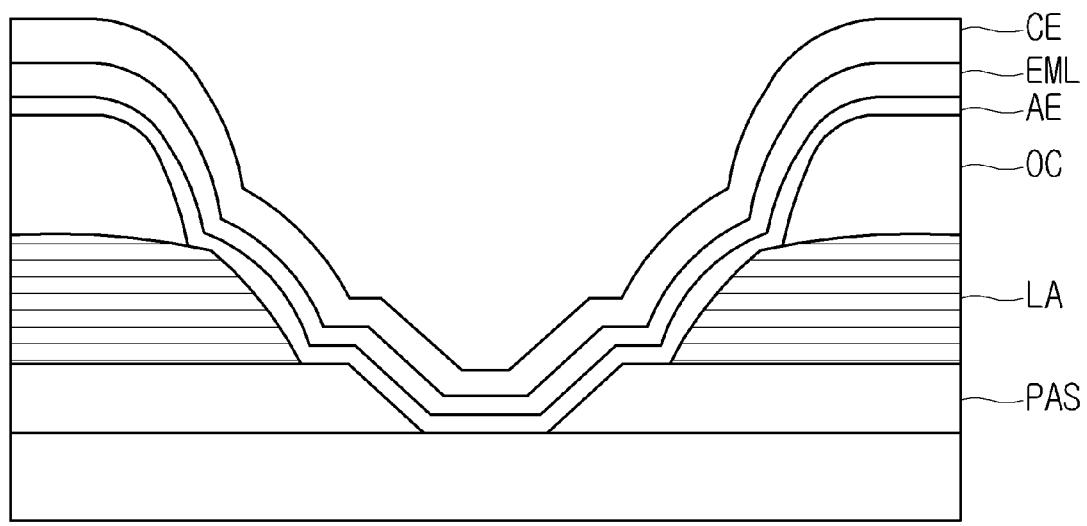
FIGS. 7A to 7E are diagrams showing a method of forming a first via hole according to an embodiment.

In an embodiment, in a region surrounding the edge of the first via hole VIA1, the light absorption layer LA may be constructed as a single absorption layer containing a pigment in a blue color as shown in FIG. 7A. The pigment in a blue color has a relatively good ability to form a positive-taper section by etching. Therefore, by forming the single absorption layer containing the pigment in a blue color around the first via hole VIA1, the problem of the short circuit between the anode electrode AE and the cathode electrode CE of the light-emitting element LD may be prevented.

Referring to the embodiment of FIG. 4, in a region surrounding the edge of the first via hole VIA1, the light absorption layer LA may be constructed as a single absorption layer containing the pigment in the blue color. In the remaining region, the light absorption layer LA may be constructed as multiple layers that include: the first absorption layer containing the pigment in the red color; and the second absorption layer containing the pigment in the blue color.

As shown in FIG. 7A, a method of forming the first via hole VIA1 surrounded by the light absorption layer LA containing a pigment in a blue color is as follows.

Figure 7B:
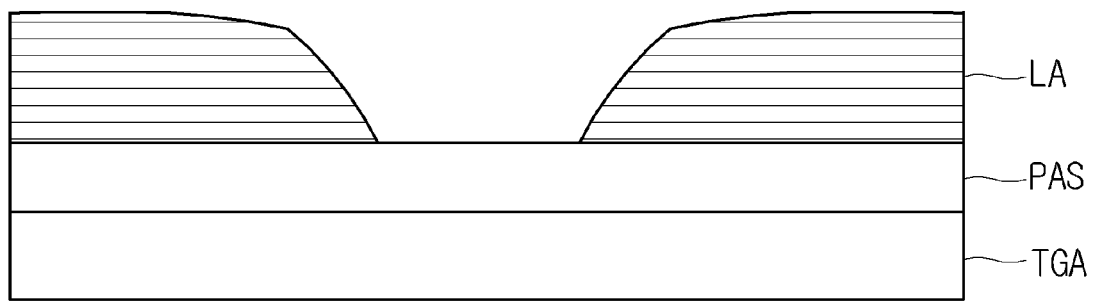

First, as shown in FIG. 7B, a passivation layer PAS is formed on the second conductive layer TGA including electrodes of circuit elements. On the passivation layer PAS, a light absorption layer LA that is formed in a pattern to have an opening corresponding to the first via hole VIA1, that is, a pigment layer in a blue color is formed.

Figure 7C:
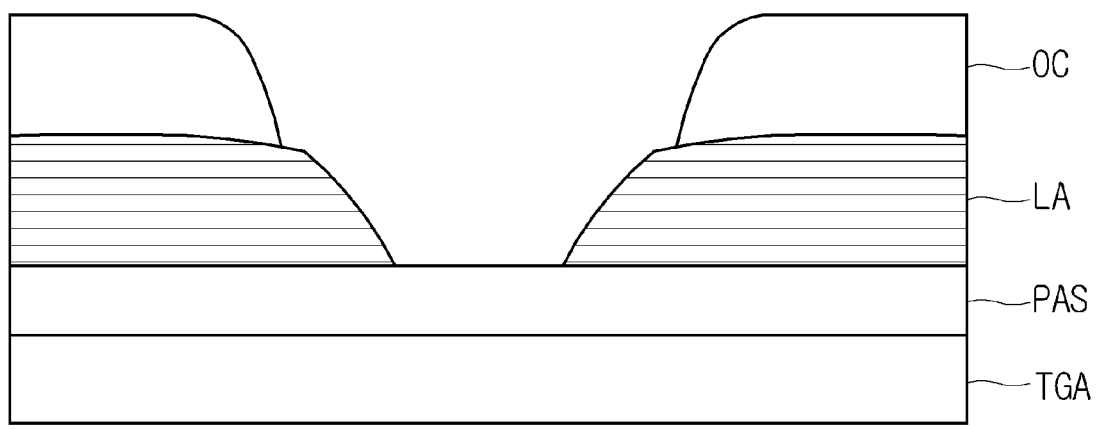

Afterward, as shown in FIG. 7C, on the light absorption layer LA, an overcoat layer OC is formed. The overcoat layer OC may be formed in a pattern to have an opening corresponding to the first via hole VIA1.

Figure 7D:
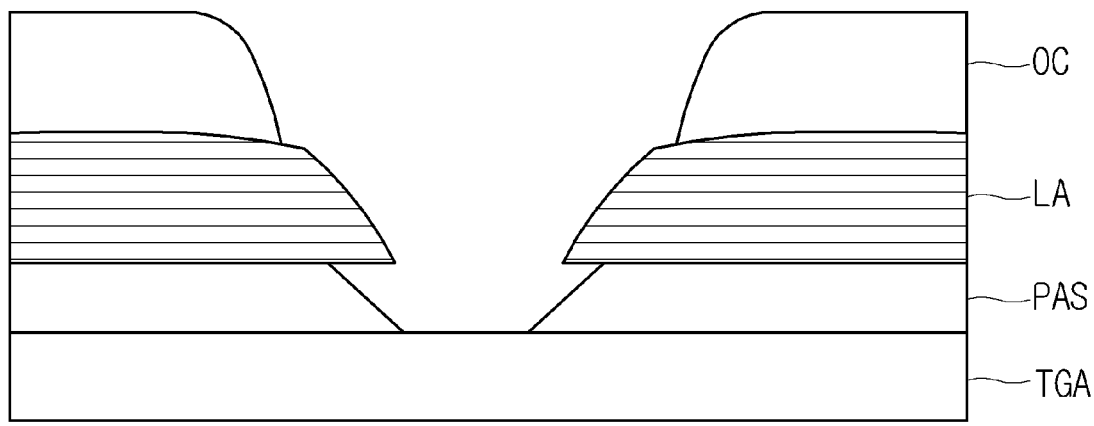

Afterward, as shown in FIG. 7D, a passivation hole is formed in the exposed passivation layer PAS.

Figure 7E:
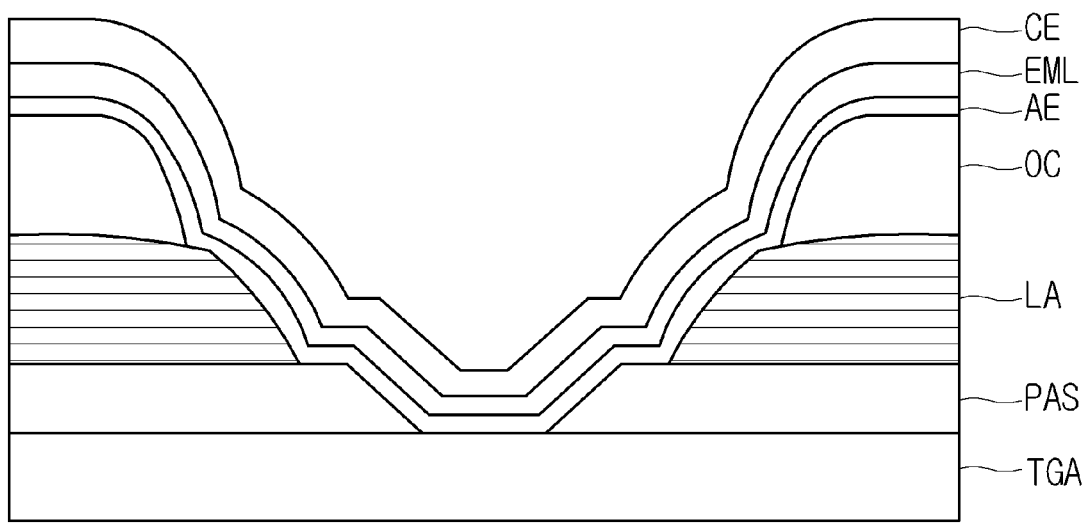

After the passivation hole is formed, the overcoat layer OC and the light absorption layer LA around the passivation hole are removed by etching the overcoat layer OC and the light absorption layer LA shown in FIG. 7E. Accordingly, the passivation hole is completely exposed to the outside, and the first via hole VIA1 penetrating through the overcoat layer OC, the light absorption layer LA, and the passivation layer PAS is formed. Afterward, the anode electrode AE, the emission layer EML, and the cathode electrode CE are stacked in order.

Figure 8:
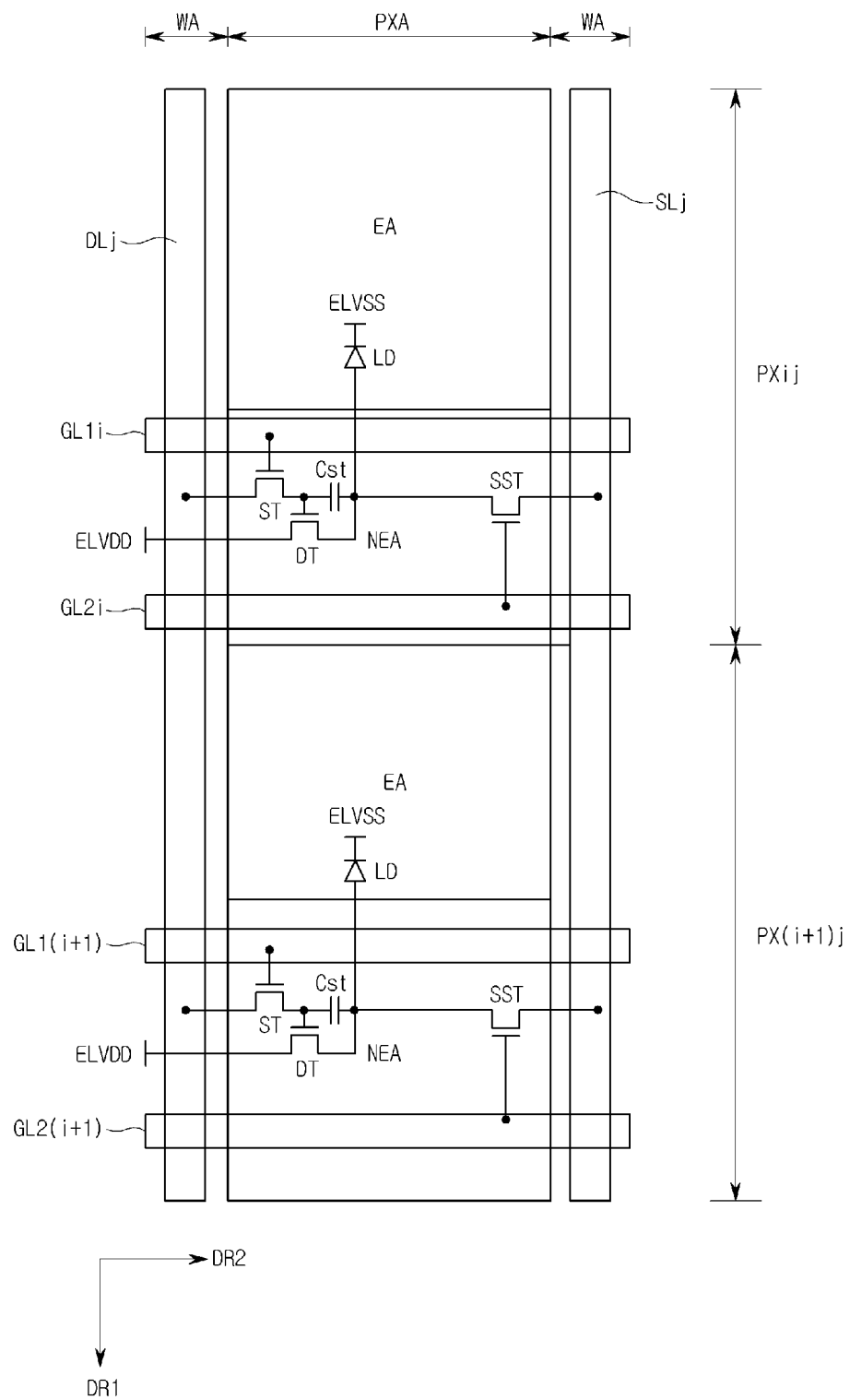
FIGS. 8 and 9 are diagrams showing a method of repairing a display device according to an embodiment.
Figure 9:
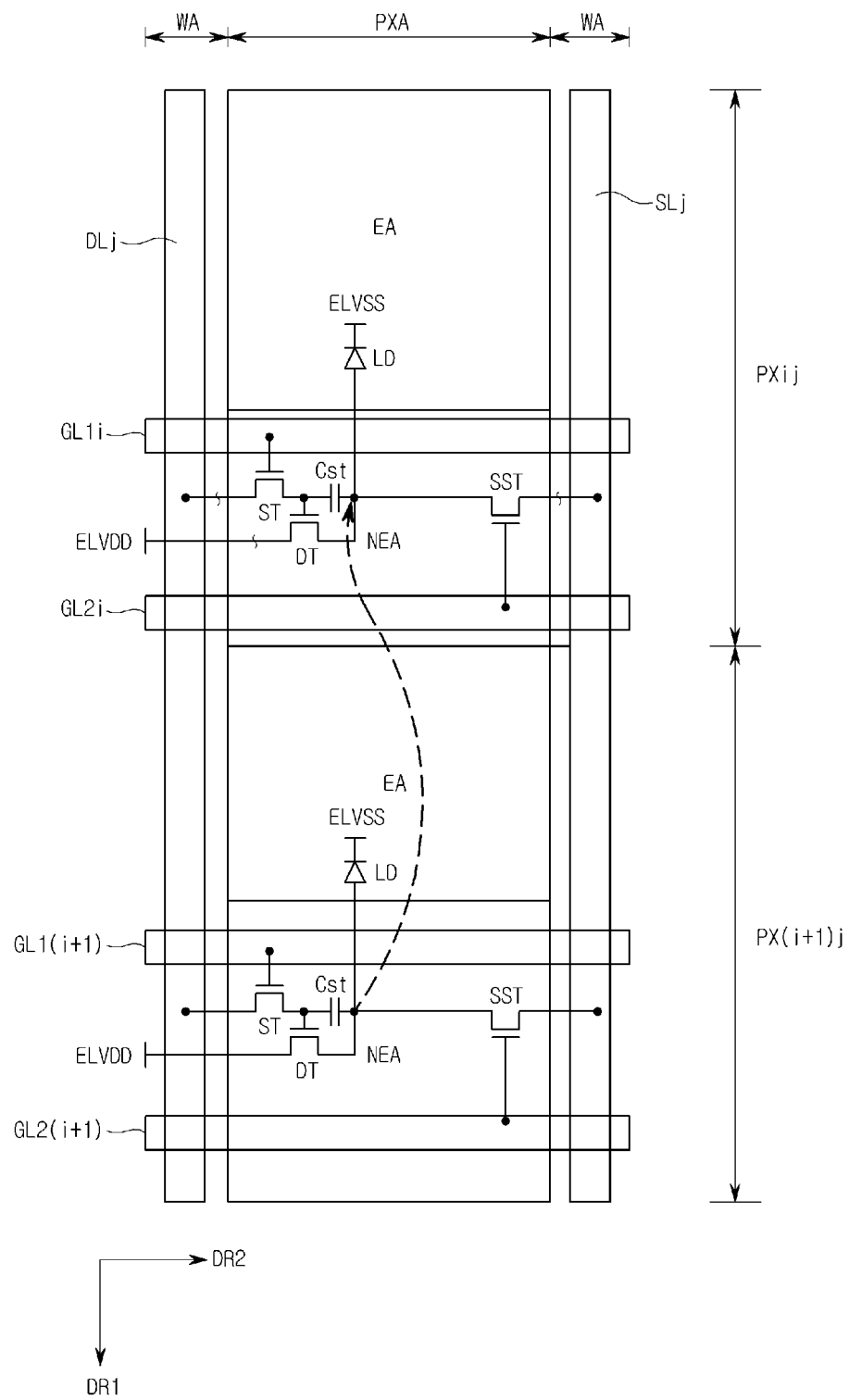
Figure 10:
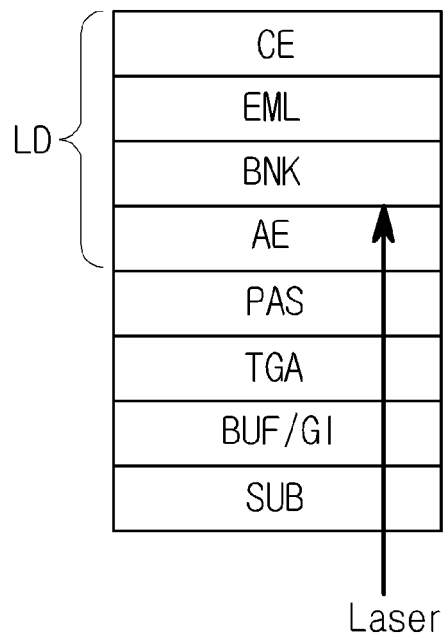
FIGS. 10 and 11 are diagrams showing a problem of a short circuit in a light-emitting element which may occur in a repair process.
Figure 11:
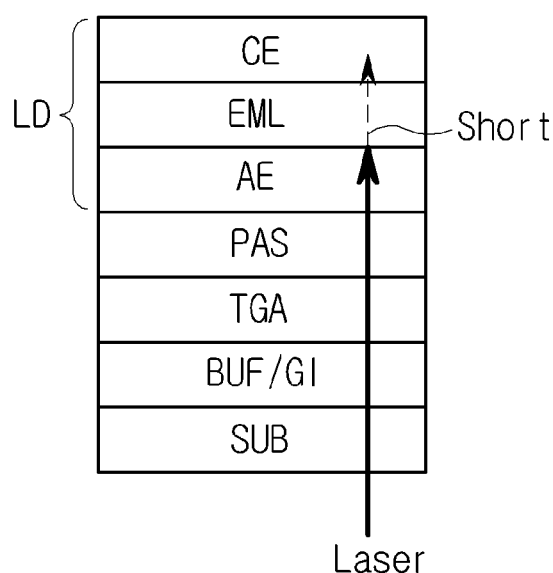
Figure 12:
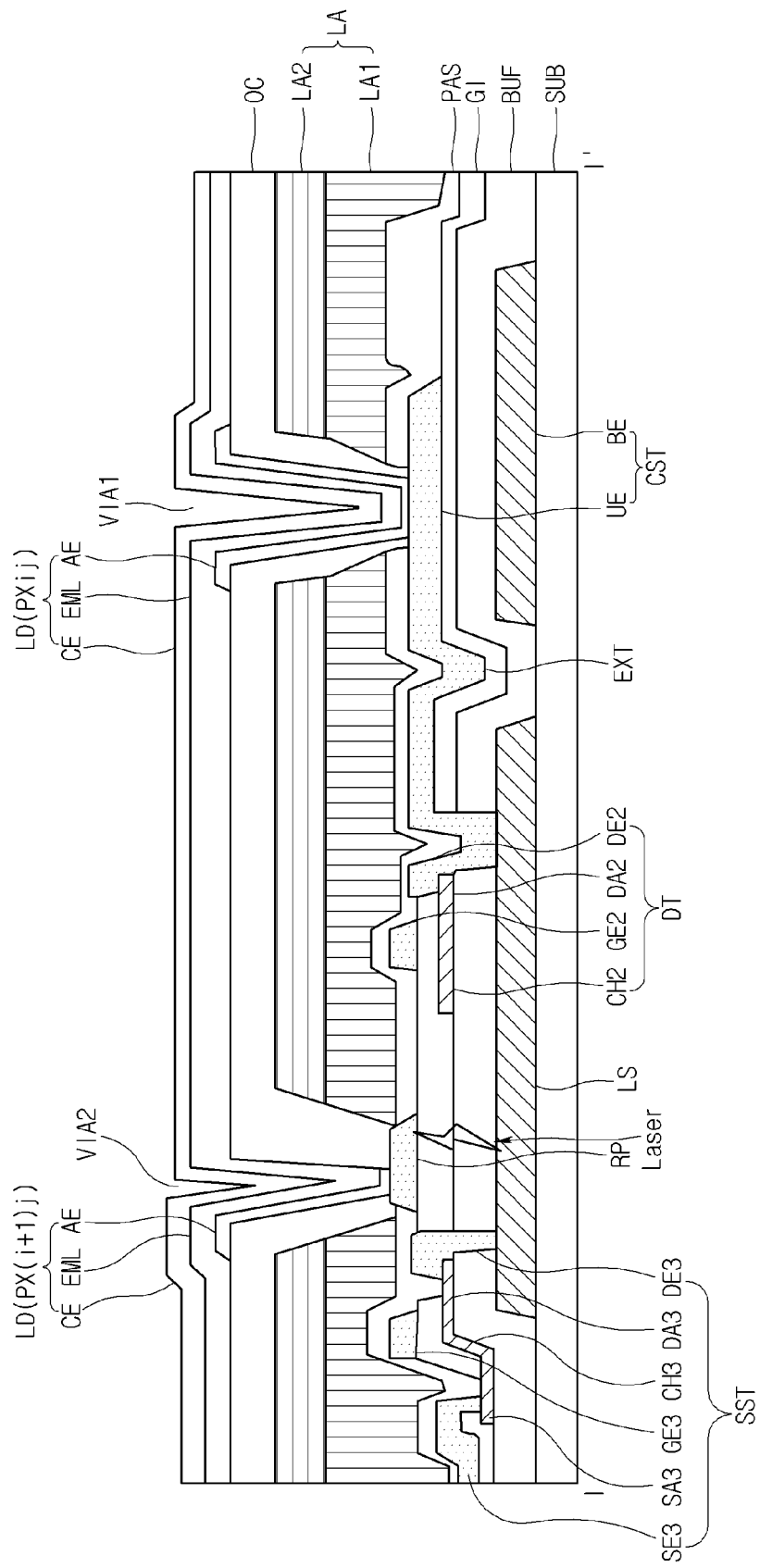
FIG. 12 is a diagram showing a method of repairing a pixel shown in FIGS. 4 and 5 according to an embodiment.

FIGS. 8 and 9 are diagrams showing a method of repairing a display device according to an embodiment. FIGS. 10 and 11 are diagrams showing a problem of a short circuit in a light-emitting element which may occur in a repair process. FIG. 12 is a diagram showing a method of repairing a pixel shown in FIGS. 4 and 5.

FIGS. 8 and 9 show two pixels PXij and PX(i+1)j arranged adjacent to each other in the first direction DR1. The pixels PXij and PX(i+1)j are arranged in a j-th pixel column, and are connected to a j-th data line DLj in common. In addition, among the pixels PXij and PX(i+1)j, a first pixel PXij is placed in an i-th pixel row and is connected to i-th gate lines GL1$i$ and GL2$i$. A second pixel PX(i+1)j is placed in an i+1-th pixel row and is connected to i+1-th gate lines GL1($i$+1) and GL2($i$+1).

Referring to FIGS. 8 and 9, the display panel 50 includes multiple pixel areas PXAs that are defined at intersection regions of the data lines (DLj), which extend in the first direction DR1, and the gate lines (GL1$i$, GL1($i$+1), GL2$i$, and GL2($i$+1)), which extend in the second direction DR2. In the pixel areas PXAs, the pixels PXij and PX(i+1)j are placed.

The pixel areas PXAs may include emission areas EAs, and non-emission areas NEAs. In the emission areas EAs, the light-emitting elements LDs of the pixels PXij and PX(i+1)j are placed. The non-emission areas NEAs include circuit elements (for example, a switching transistor ST, a driving transistor DT, a sensing transistor SST, and a storage capacitor Cst) for driving the light-emitting elements LDs. The light-emitting elements LDs are driven by the circuit elements placed in the non-emission area NEA and emit light in a particular color.

Between the pixel areas PXAs adjacent in the second direction DR2, wire areas WAs may be defined. In the wire areas WAs, the data lines (DLj) and the sensing lines (SLj) that extend in the first direction DR1 are placed. The first gate lines (GL1$i$ and GL1($i$+1)) and the second gate lines (GL2$i$ and GL2($i$+1)) extend in the second direction DR2, across the non-emission area NEA.

The data lines (DLj), the sensing lines (SLj), the first gate lines (GL1$i$ and GL1($i$+1)), and the second gate lines (GL2$i$, GL2($i$+1)) are electrically connected to the circuit elements through contact holes. Specifically, the data lines (DLj) may be electrically connected to electrodes (for example, source electrodes) of the switching transistors STs. The sensing lines (SLj) may be electrically connected to electrodes (for example, source electrodes) of the sensing transistors SSTs. The first gate lines (GL1i and GL1(i+1)) are electrically connected to the gate electrodes of the switching transistors STs, and the second gate lines (GL2i and GL2(i+1)) are electrically connected to the gate electrodes of the sensing transistors SSTs.

In various embodiments, as at least one or some of driving lines are cut, defects, such as dark spots, or the like, may occur in the corresponding pixels PXij and PX(i+1)j. For example, as shown in FIG. 9, the line between the switching transistor ST of the first pixel PXij and the j-th data line DLj, between the sensing transistor SST of the first pixel PXij and the j-th sensing line SLj, and/or between the driving transistor DT of the first pixel PXij and the first power line PL1 through which the high-potential driving voltage ELVDD is supplied, may be cut. Then, a correct driving current is not applied to the first pixel PXij, the light-emitting element LD of the first pixel PXij does not emit light, and thus a dark spot may be viewed.

In order to repair the defective pixel PXij, the anode electrode AE of the light-emitting element LD of the first pixel PXij may be electrically connected to the anode electrode AE of the light-emitting element LD of the second pixel PX(i+1)j adjacent to the first pixel PXij, as shown in FIG. 9, Then, the driving current of the second pixel PX(i+1)j is applied to the light-emitting element LD of the first pixel PXij. Accordingly, the first pixel PXij may emit light in response to the same data signal as the second pixel PX(i+1)j, thereby repairing the dark-spot defect.

A repair process may be performed through laser welding. Specifically, the repair process may be performed by irradiating any repair pattern provided in the non-emission area NEA of the first pixel PXij with a laser beam to remove an insulation film interposed between the repair pattern RP and the anode electrode AE of the second pixel PX(i+1)j, and by forming electrical connection between the repair pattern and the anode electrode AE of the second pixel PX(i+1)j.

As described above with reference to FIG. 5, the pixels PXij and PX(i+1)j include the substrate SUB, the buffer layer BUF and the gate insulation layer GI, which are stacked on the substrate SUB in that order, the second conductive layer TGA, and the passivation layer PAS. On the passivation layer PAS, the anode electrode AE, the emission layer EML, and the cathode electrode CE of the light-emitting element LD are stacked. In the case of the display device 1 provided with a bank, in the non-emission area NEA of the pixels PXij and PX(i+1)j, a bank layer BNK for defining the emission areas EAs may be formed between the anode electrode AE and the emission layer EML.

As shown in FIG. 10, in the case where the bank layer BNK is formed in the non-emission area NEA, the laser beam with which the non-emission area NEA is irradiated is blocked by the bank layer BNK, and thus does not damage the light-emitting element LD placed at the upper layer. However, in the bankless structure in which the bank layer BNK is not formed as shown in FIG. 11, one or some layers of the light-emitting element LD may be damaged by the laser beam, causing an electrical short circuit between the anode electrode AE and the cathode electrode CE.

In order to solve this problem, in the embodiment shown in FIG. 5, the repair pattern RP is placed in such a manner that a region thereof is not overlapped by the anode electrode AE of the nearby pixel PX(i+1)j, but overlaps the light-shielding layer LS. Electrode layers other than the light-shielding layer LS may not be placed on or under the region. A region of the repair pattern RP except the above-described region is electrically connected to the anode electrode AE of the nearby pixel PX(i+1)j through the second via hole VIA2.

Referring to FIG. 12, laser welding is performed on the region where the light-shielding layer LS and the repair pattern RP overlap. Because the region that is not overlapped by the anode electrode AE of the second pixel PX(i+1)j is irradiated with a laser beam, the electrical short circuit between the anode electrode AE and the cathode electrode CE may be prevented by the laser beam.

The insulation layers between the light-shielding layer LS and the repair pattern RP may be removed by laser welding, and electrical connection between the light-shielding layer LS and the repair pattern RP may be formed. Passing through the second drain electrode DE2 of the driving transistor DT of the first pixel PXij and the upper electrode UE of the storage capacitor Cst, the light-shielding layer LS is connected to the anode electrode AE of the light-emitting element LD. The repair pattern RP is connected to the anode electrode AE of the light-emitting element LD of the second pixel PXij through the second via hole VIA2. Therefore, when the light-shielding layer LS is electrically connected to the repair pattern RP by laser welding, the anode electrode AE of the light-emitting element LD of the first pixel PXij is connected to the anode electrode AE of the light-emitting element LD of the second pixel PX(i+1)j. Then, when the driving current is applied to the anode electrode AE of the light-emitting element LD of the second pixel PX(i+1)j, the same driving current is applied to the anode electrode AE of the light-emitting element LD of the first pixel PXij, and the first pixel PXij may emit light at the same luminance as the second pixel PX(i+1)j.

Figure 13:
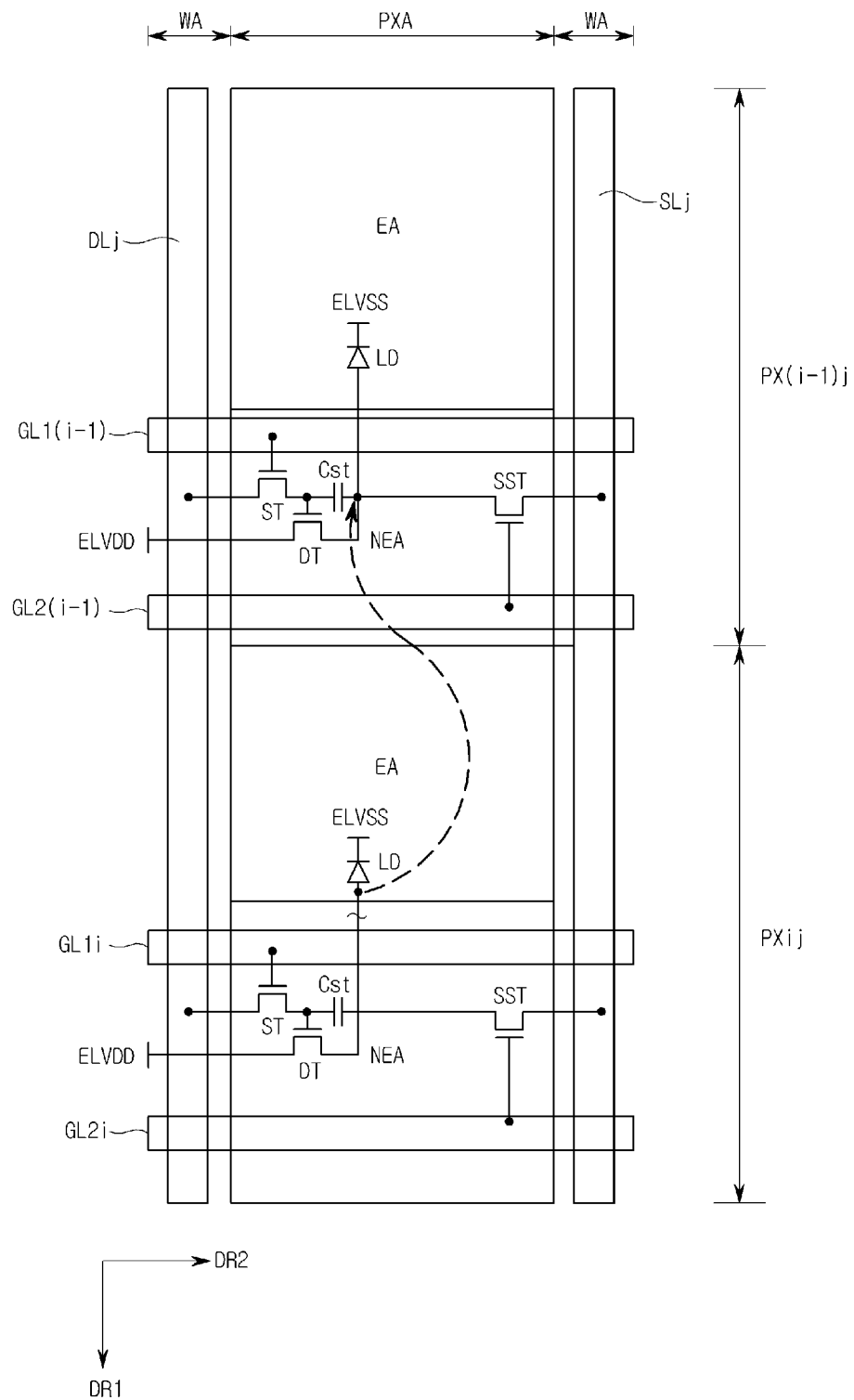
FIG. 13 is a diagram showing a method of repairing a display device according to another embodiment.
Figure 14:
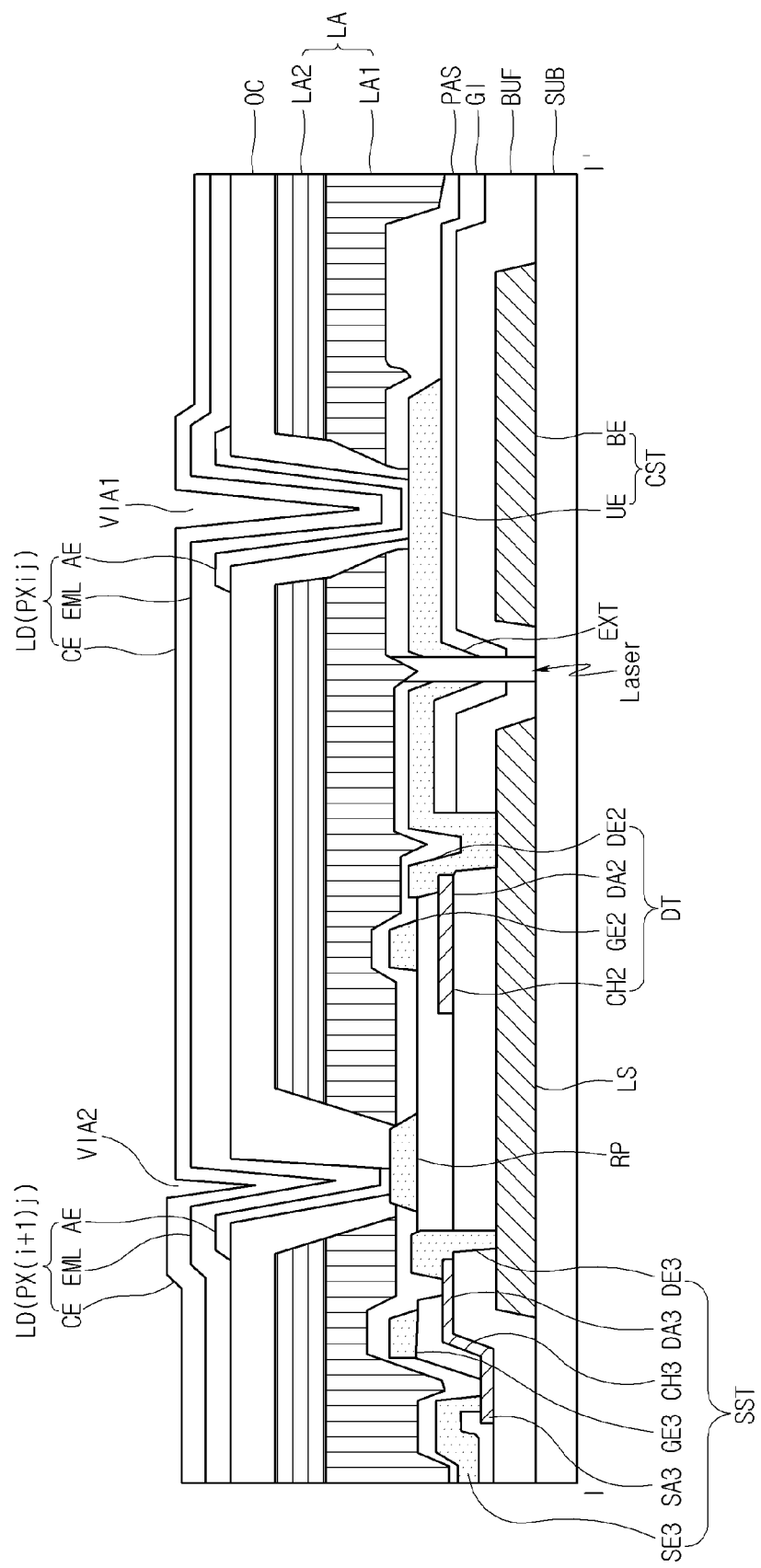
FIG. 14 is a diagram showing a method of repairing a pixel shown in FIGS. 4 and 5 according to an embodiment.

FIG. 13 is a diagram showing a method of repairing a display device according to another embodiment. FIG. 14 is a diagram showing a method of repairing a pixel shown in FIGS. 4 and 5.

FIG. 13 shows two pixels PX(i−1)j and PXij arranged near to each other in the first direction DR1. The pixels PX(i−1)j and PXij are arranged in a j-th pixel column, and are connected to a j-th data line DLj in common. In addition, among the pixels PX(i−1)j and PXij, a first pixel PX(i−1)j is placed in an i−1-th pixel row and is connected to a i−1-th first gate line GL1(i−1). A second pixel PXij is placed in an i-th pixel row and is connected to an i-th first gate line GL1i.

In an embodiment, a defect may occur in the driving circuit for driving the light-emitting element LD of the second pixel PXij, and thus the light-emitting element LD may not emit light correctly. In order to repair the defective pixel, for example, the second pixel PXij, as shown in FIG. 13, the light-emitting element LD of the second pixel PXij may be separated from the driving circuit. Afterward, the anode electrode AE of the light-emitting element LD of the second pixel PXij may be electrically connected to the anode electrode AE of the light-emitting element LD of a nearby pixel, for example, the first pixel PX(i−1)j. Then, the driving current of the first pixel PX(i−1)j is applied to the light-emitting element LD of the second pixel PXij. Accordingly, the second pixel PXij may emit light in response to the same data signal as the first pixel PX(i−1)j, thereby repairing the defect in the pixel.

A repair process may be performed through laser cutting and laser welding. Specifically, in the non-emission area NEA of the second pixel PXij, when the anode electrode AE of the light-emitting element LD is irradiated with a laser beam, disconnection occurs between the anode electrode AE and the driving circuit. Afterward, the anode electrode AE of the light-emitting element LD of the first pixel PX(i−1)j may be electrically connected to the anode electrode AE of the light-emitting element LD of the second pixel PXij through laser welding.

As described above with reference to FIGS. 10 and 11, laser cutting in the bankless structure may cause an electrical short circuit between the anode electrode AE and the cathode electrode CE. In order to solve this problem, in the embodiment shown in FIG. 5, the lower electrode BE of the storage capacitor Cst may include an extended part EXT for connection with the second gate electrode GE2 of the driving transistor DT. On the extended part EXT, the lower electrode BE is overlapped by the second gate electrode GE2, and is electrically connected to the second gate electrode GE2 through the third contact hole CT3. At least a region of the extended part EXT is placed not to be overlapped by the other electrodes of the circuit elements and the anode electrode AE of the light-emitting element LD.

Referring to FIG. 14, laser cutting is performed on the extended part EXT. Because the region that is not overlapped by the anode electrode AE of the second pixel PXij is irradiated with a laser beam, the electrical short circuit between the anode electrode AE and the cathode electrode CE may be prevented by the laser beam.

When the extended part EXT is cut by laser cutting, the second drain electrode DE2 of the driving transistor DT and the lower electrode BE of the storage capacitor Cst are electrically separated. Passing through the extended part EXT of the lower electrode BE, the second drain electrode DE2 is connected to the anode electrode AE of the light-emitting element LD. Therefore, the driving transistor DT and the light-emitting element LD may be electrically separated by cutting of the extended part EXT.

After laser cutting, the anode electrode AE of the light-emitting element LD of the second pixel PXij may be electrically connected to the anode electrode AE of the light-emitting element LD of the first pixel PX(i−1) through laser welding. The repair method using laser welding is the same as that described with reference to FIG. 12, so a detailed description thereof will be omitted.

Figure 15:
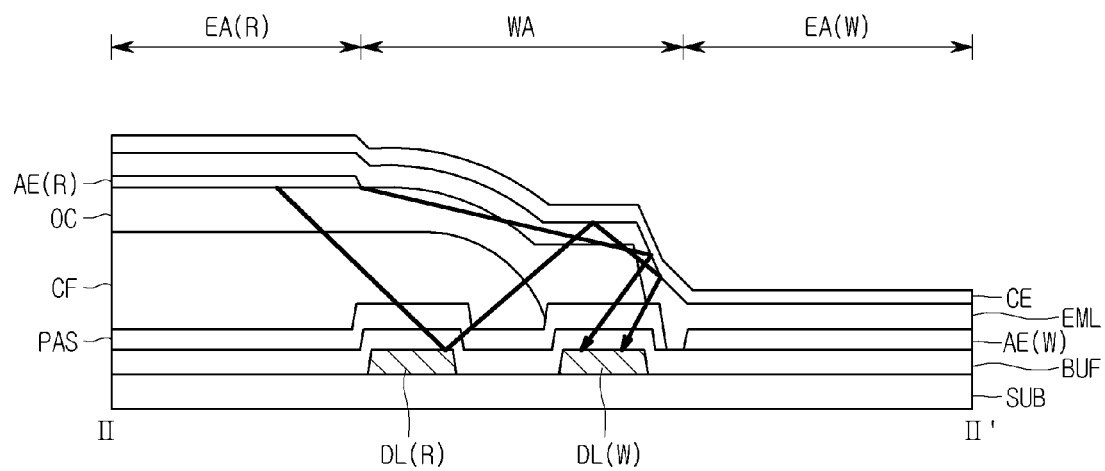
FIG. 15 is a cross-sectional view taken along line II-II' of FIG. 3A according to an embodiment.

FIG. 15 is a cross-sectional view taken along line of FIG. 3A according to one embodiment.

Referring to FIGS. 3A, 3B, and 4, in order for the pixel to display a required color, the light generated by the light-emitting element LD needs to be emitted outside the display panel 50 via the color filter. In the case where the pixel is constructed as having a bankless structure, light shielding is not performed around the emission area EA. Therefore, the light emitted from the light-emitting element LD is discharged to the periphery of the emission area EA and is thus emitted outside the display panel 50 without passing through the color filter. Accordingly, a light leakage and a color-fading phenomenon may occur.

In the case of a white pixel displaying a white color, a color filter is not provided, and the light generated by the light-emitting element LD is emitted outside the display panel 50 without passing through a color filter. Therefore, in the case of the white pixel, the light leakage and the color-fading phenomenon may not be a problem.

In order to solve the light leakage and the color-fading phenomenon in pixels displaying red, blue, and green colors, in an embodiment, a pixel may have a structure as shown in FIG. 15.

Specifically, referring to FIG. 15, the emission area EA of the white pixel W may have a form in which the overcoat layer OC is removed, compared to FIG. 4. For example, the overcoat layer OC may be formed in an area except the emission area EA of the white pixel W through a photolithography process using a halftone mask. Accordingly, at the edge of the emission area EA of the white pixel W, the overcoat layer OC has the difference in level.

After the overcoat layer OC is formed, the anode electrode AE of each of the pixels in the emission area EA may be formed in a pattern. In a red pixel R, the anode electrode AE is formed on the overcoat layer OC. Since the overcoat layer OC is not formed in the white pixel W, the anode electrode AE may be formed on the buffer layer BUF, which is the lower layer. In the shown embodiment, in the case of the white pixel W, the anode electrode AE is formed on the buffer layer BUF, but this embodiment is not limited thereto. That is, in various embodiments, the passivation layer PAS may be formed in the emission area EA of the white pixel W. Herein, the anode electrode AE may be formed on the passivation layer PAS. That is, excluding the overcoat layer OC, the anode electrode AE may be formed on the exposed lower layer of the emission area EA.

Afterward, the emission layer EML and the cathode electrode CE may be formed. Along the overcoat layer OC provided with the difference in level, the emission layer EML and the cathode electrode CE also have the difference in level at the edge of the emission area EA of the white pixel W. In the region with the difference in level, the emission layer EML and the cathode electrode CE cover the exposed side of the overcoat layer OC, and thus have a bend around the step. Herein, the bend may include at least one angular shape or at least one curved-surface shape.

When light is emitted from the light-emitting element LD of the red pixel R, light discharged to the non-emission area NEA in which a color filter CF is not formed goes in the direction of the nearby white pixel W. This light reflects off the bend of the cathode electrode CE, and the traveling direction of the light may be controlled towards a lower position of the display panel 50. By the data line DL placed along the edge of the emission area EA of the white pixel W, the reflected light may be blocked from being emitted outside the display panel 50.

As described above, in the display panel 50 according to an embodiment, the difference in level of the cathode electrode CE is formed at a periphery of another nearby pixel through removal of the overcoat layer OC of the white pixel W. Then, the light discharged from the light-emitting element LD to the non-emission area NEA in which the color filter CF is not formed reflects off the cathode electrode CE, and is blocked by a conductive layer, such as the data line DL, or the like, of the lower layer, thereby solving the light leakage and the color-fading phenomenon.

Figure 16:
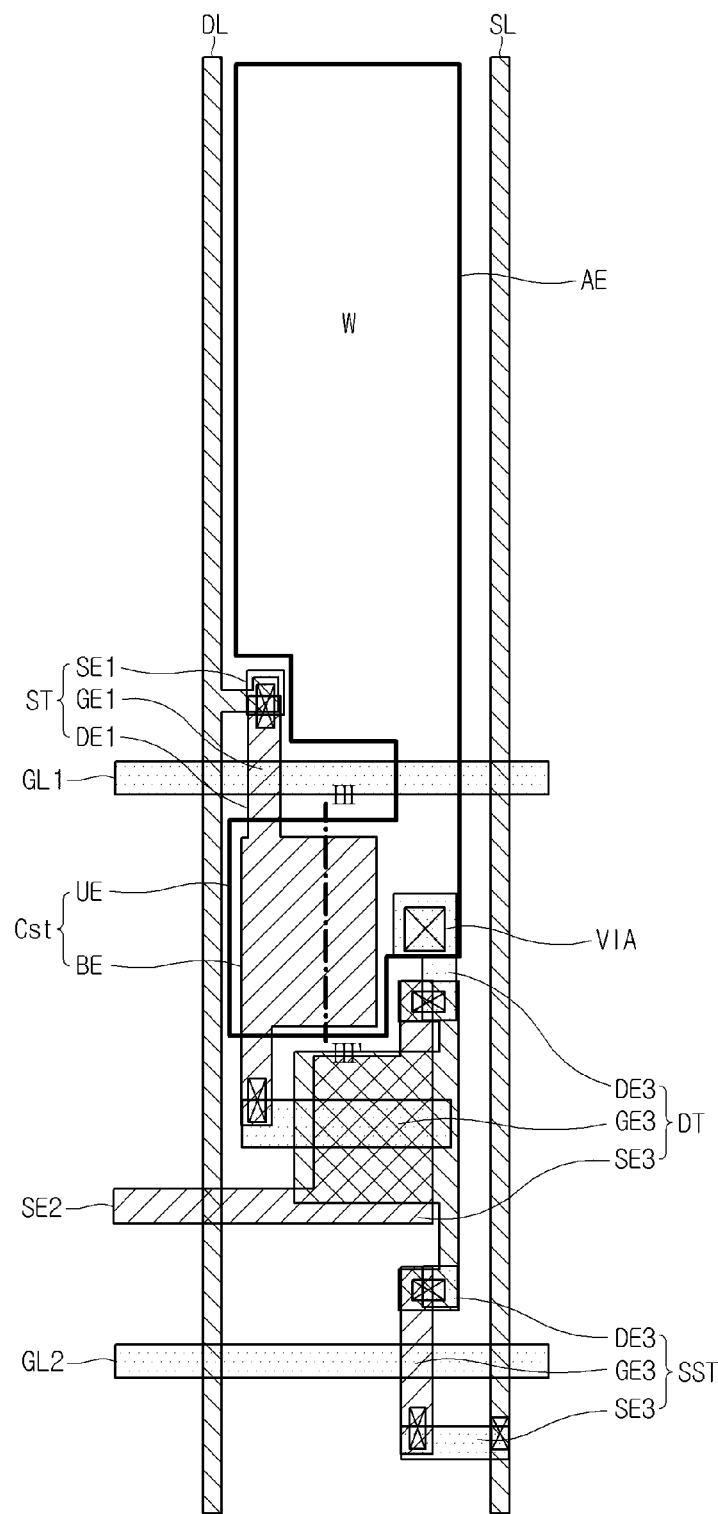
FIG. 16 is a diagram showing a plane layout of a white pixel according to another embodiment.
Figure 17:
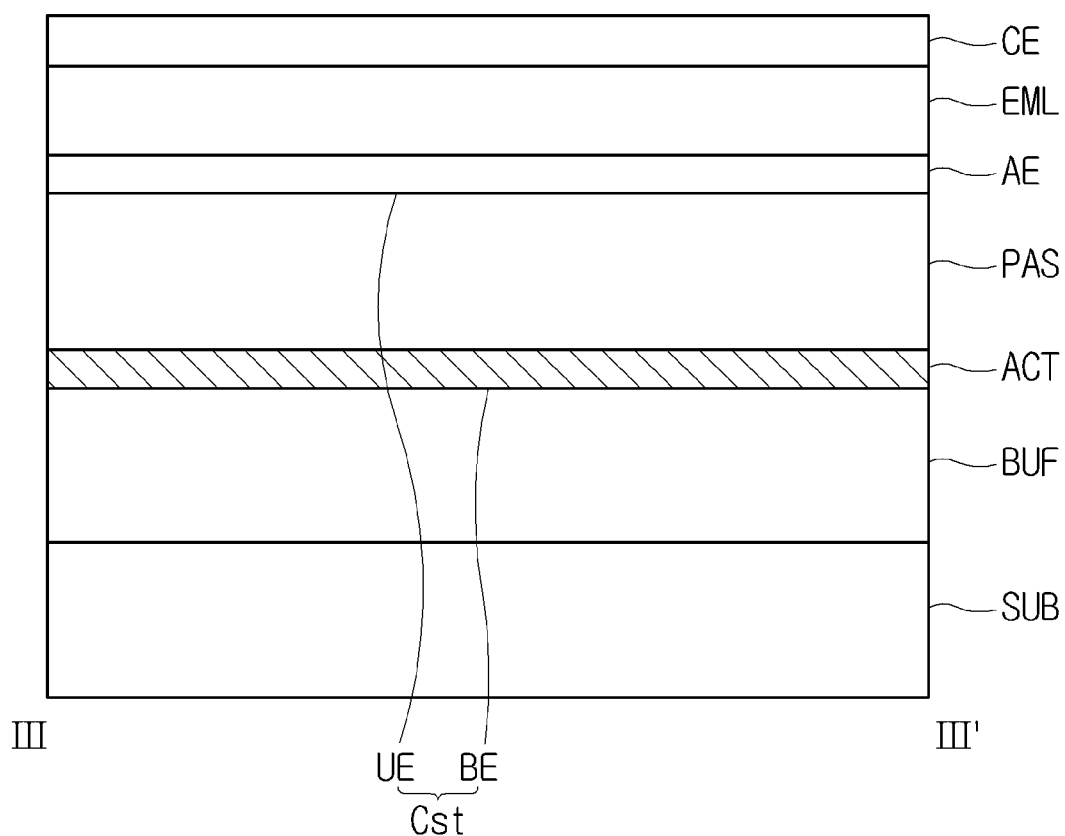
FIG. 17 is a cross-sectional view taken along line III-III' of FIG. 16 according to an embodiment.

FIG. 16 is a diagram showing a plane layout of a white pixel according to another embodiment. FIG. 17 is a cross-sectional view taken along line III-III' of FIG. 16 according to one embodiment.

Referring to FIGS. 2 and 16 together, a pixel PX may include a switching transistor ST, a driving transistor DT, a sensing transistor SST, a storage capacitor Cst, and a light-emitting element LD.

The switching transistor ST may include a first gate electrode GE1, a first source electrode SE1, and a first drain electrode DEL The first gate electrode GE1 may be placed overlapping a first channel formed in an active layer ACT. The first channel may be a semiconductor pattern to which impurities are not doped within the active layer ACT. The first gate electrode GE1 may be electrically connected to the first gate line GL1. For example, the first gate electrode GE1 may be a region overlapping the first channel on the first gate line GL1.

The first source electrode SE1 may be connected to a source area formed on a first side of the first channel in the active layer ACT. The first source electrode SE1 may be further connected to the data line DL through a contact hole.

The first drain electrode DE1 may be a drain area formed on a second side of the first channel in the active layer ACT. The first drain electrode DE1 may be formed being integrated with a lower electrode BE of the storage capacitor Cst.

The driving transistor DT may include a second gate electrode GE2, a second source electrode SE2, and a second drain electrode DE2.

The second gate electrode GE2 may be placed overlapping a second channel formed in the active layer ACT. The second gate electrode GE2 may be electrically connected to the lower electrode BE of the storage capacitor Cst through a contact hole.

The second source electrode SE2 may be a second source area formed on a first side of the second channel in the active layer ACT. The second source electrode SE2 may be electrically connected to the first power line PL1 through which the high-potential driving voltage ELVDD is applied.

The second drain electrode DE2 may be connected to a second drain area formed on a second side of the second channel in the active layer ACT. The second drain electrode DE2 may be connected to an anode electrode AE of the light-emitting element LD through a via hole VIA.

In addition, the second drain electrode DE2 may be connected to a light-shielding layer LS through a contact hole. The light-shielding layer LS is connected to the third drain electrode DE3 of the sensing transistor SST. Therefore, the second drain electrode DE2 may be connected to the third drain electrode DE3 of the sensing transistor SST through the light-shielding layer LS.

The sensing transistor SST may include a third gate electrode GE3, a third source electrode SE3, and a third drain electrode DE3.

The third gate electrode GE3 may be placed overlapping a third channel formed in the active layer ACT. The third gate electrode GE3 may be electrically connected to the second gate line GL2. For example, the third gate electrode GE3 may be a region overlapping the third channel on the second gate line GL2.

The third source electrode SE3 may be connected to a third source area formed on a first side of the third channel in the active layer ACT. The third source electrode SE3 may be electrically connected to the sensing line SL through a contact hole.

The third drain electrode DE3 may be connected to a third drain area formed on a second side of the third channel in the active layer ACT. In addition, the third drain electrode DE3 may be connected to the light-shielding layer LS through a contact hole. Passing through the light-shielding layer LS, the third drain electrode DE3 is electrically connected to the second drain electrode DE2 of the driving transistor DT and the anode electrode AE.

The storage capacitor Cst may include the lower electrode BE and an upper electrode UE.

The lower electrode BE constitutes the active layer ACT. The lower electrode BE may be electrically connected to the first drain electrode DE1 of the switching transistor ST through a contact hole. In addition, the lower electrode BE may be electrically connected to the second gate electrode GE2 of the driving transistor DT through a contact hole.

The upper electrode UE is formed in such a manner that at least a region thereof covers the lower electrode BE. Between the upper electrode UE and the lower electrode BE, electric charges corresponding to the potential difference between the two electrodes are stored, so that the upper electrode UE and the lower electrode BE may operate as a storage capacitor Cst.

The upper electrode UE is constructed as a region of the anode electrode AE. That is, the upper electrode UE may be an extended part for the non-emission area NEA of the anode electrode AE formed in the emission area EA.

The upper electrode UE may be electrically connected to the second drain electrode DE2 of the driving transistor DT through a via hole VIA.

The light-emitting element LD may include the anode electrode AE, the cathode electrode CE, and an emission layer EML placed between the anode electrode AE and the cathode electrode CE.

Generally, the anode electrode AE is formed in the emission area EA, and is provided with a region extending to the non-emission area NEA. The extended region may be placed in such a manner as to overlap the lower electrode BE of the storage capacitor Cst, and may constitute the upper electrode UE of the storage capacitor Cst. In this embodiment, the extended region may have a sufficient area so as to secure the storage capacitance of the storage capacitor Cst.

On the anode electrode AE, the emission layer EML and the cathode electrode CE are formed. The emission layer EML and the cathode electrode CE may be formed widely in the emission area EA and the non-emission area NEA. Herein, as the emission layer EML and the cathode electrode CE are stacked on the region extending to the non-emission area NEA of the anode electrode AE, light may be emitted from the non-emission area NEA. This has the effect of substantially expanding the emission area EA of the white pixel W.

Referring to FIG. 17, the storage capacitor Cst include the lower electrode BE formed in the active layer ACT, and the upper electrode UE constructed as the extended region of the anode electrode AE. As the upper electrode UE is constructed as the anode electrode AE, the upper electrode UE of the storage capacitor Cst may emit light.

The embodiment described with reference to FIG. 15 may be applied to the embodiment of FIGS. 16 and 17. That is, the overcoat layer OC may not be formed in the emission area EA of the white pixel W. In the embodiment of FIGS. 16 and 17, since the upper electrode UE of the storage capacitor Cst is constructed as the anode electrode AE and substantially extends the emission area EA, the overcoat layer OC may not be formed in the region where the upper electrode UE is placed.

In this embodiment, between the lower electrode BE and the upper electrode UE of the storage capacitor Cst, at least one insulation layer interposed between the active layer ACT and the anode electrode AE may be interposed, except the overcoat layer OC. For example, between the lower electrode BE and the upper electrode UE, a passivation layer PAS may be interposed.

Figure 18:
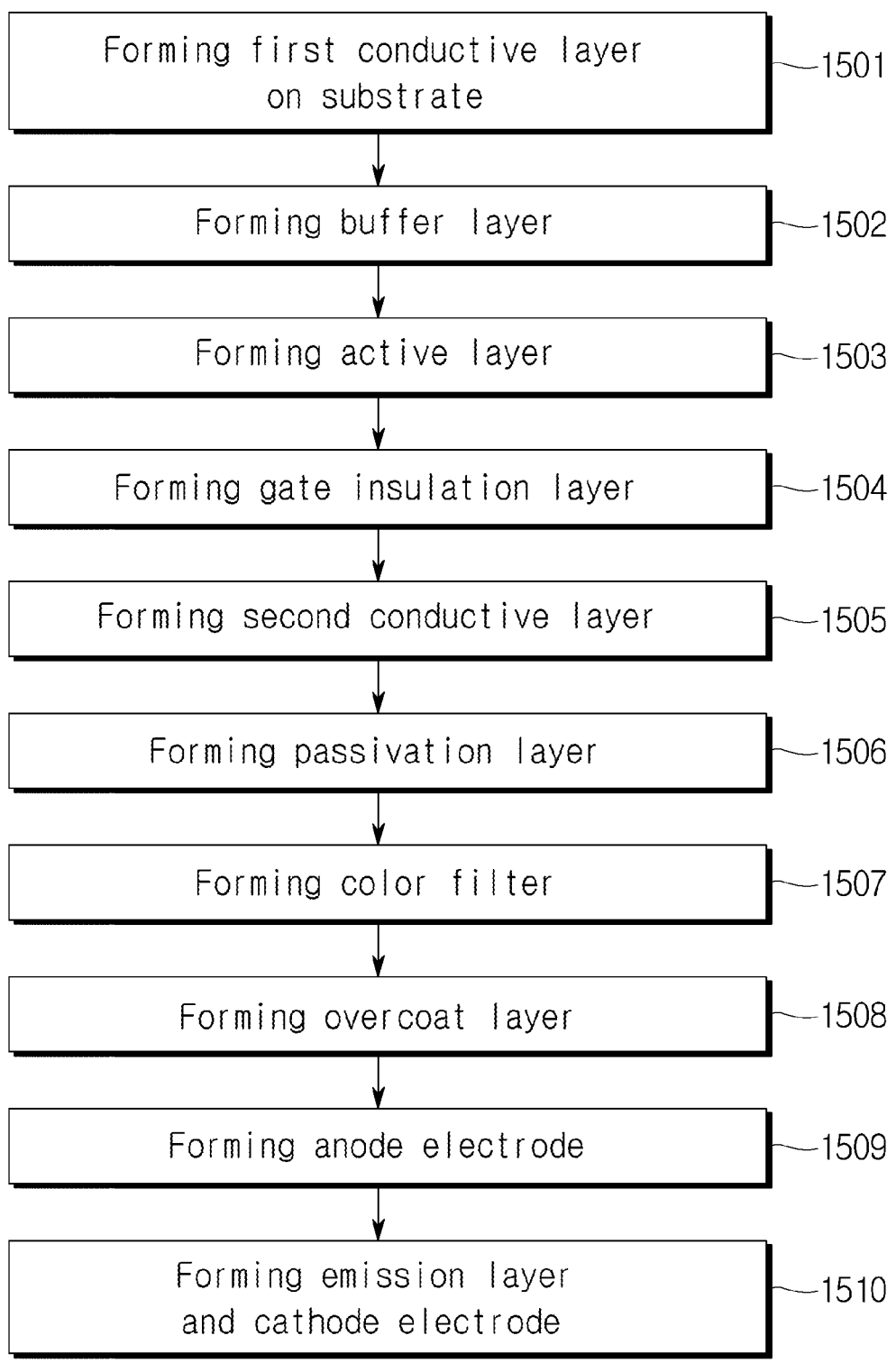
FIG. 18 is a flowchart showing a method of manufacturing a display device according to an embodiment.

FIG. 18 is a flowchart showing a method of manufacturing a display device according to an embodiment. Specifically, FIG. 18 shows a method of manufacturing the display panel 50 that has the pixels (PXij) described above with reference to FIGS. 4 and 5.

Referring to FIG. 18 with FIGS. 3A, 3B, and 4, first, the circuit element layer may be formed on the substrate SUB. Specifically, the first conductive layer may be formed on the substrate SUB at step 1501. The first conductive layer may be generated by forming a conductive film on the substrate SUB through a printing process, a sputtering process, a chemical vapor deposition process, a pulsed laser deposition (PLD) process, a vacuum deposition process, an atomic layer deposition process, or the like; and by performing patterning through an etching process using a mask. Herein, a first mask may be used.

Afterward, the buffer layer BUF may be formed on the first conductive layer at step 1502. The buffer layer BUF may be formed through a chemical vapor deposition process, a spin coating process, a plasma-enhanced chemical vapor deposition process, a sputtering process, a vacuum deposition process, a high-density plasma-chemical vapor deposition process, a printing process, or the like.

The active layer ACT may be formed on the buffer layer BUF at step 1503. For example, an amorphous silicon layer may be formed on the buffer layer BUF, and the amorphous silicon layer may crystallize to form a polysilicon layer. Afterward, the polysilicon layer is subjected to patterning through photolithography, or the like, thereby forming the active layer ACT. Herein, a second mask may be used for the photolithography process. Impurities are injected into the polysilicon layer constituting the active layer ACT so that the source areas SA1, SA2, and SA3, the drain areas DA1, DA2, and DA3, and the channels CH1, CH2, and CH3 are formed. In the buffer layer BUF, contact holes for enabling the first conductive layer and the upper layer to be in contact with each other may be further formed.

The gate insulation layer GI may be formed on the active layer ACT at step 1504. The gate insulation layer GI may be selectively formed in a region where the second conductive layer is to be formed, which will be described later. Specifically, the gate insulation layer GI may be formed through photolithography, or the like, in which the gate insulation layer GI is exposed and developed by using a mask. Herein, a third mask may be used.

The second conductive layer may be formed on the gate insulation layer GI at step 1505. The second conductive layer may be generated by forming a conductive film on the gate insulation layer GI through a printing process, a sputtering process, a chemical vapor deposition process, a pulsed laser deposition (PLD) process, a vacuum deposition process, an atomic layer deposition process, or the like; and by performing patterning through an etching process using a mask. Herein, a fourth mask may be used.

Afterward, the passivation layer PAS may be formed so as to cover the second conductive layer at step 1506. The color filter may be formed on the passivation layer PAS at step 1507. For the color filter, for example, a color filter in a first color may be formed in a pattern by using a first mask, a color filter in a second color may be formed in a pattern by using a second mask, and a color filter in a third color may be formed in a pattern by using a third mask. While the color filter is formed, the light absorption layer LA is formed together. In order to form the color filter and the light absorption layer LA, three masks corresponding to the respective colors, that is, a fifth to a seventh mask may be used.

Afterward, the overcoat layer OC is formed so as to cover the color filter and the light absorption layer LA at step 1508. The overcoat layer OC may be exposed and developed on the passivation layer PAS by using a mask. The mask may include openings corresponding to the via holes VIA1 and VIA2. Herein, an eighth mask may be used.

The light-emitting element may be formed on the overcoat layer OC. Specifically, on the overcoat layer OC, the anode electrode AE is formed in a pattern by using a ninth mask that has an opening corresponding to the emission areas EAs, at step 1509. Afterward, the emission layer EML and the cathode electrode CE are formed widely on the overcoat layer OC so as to cover the whole area of the anode electrode AE at step 1510.

In order to manufacture the display panel 50 having the bankless structure described above, generally nine masks may be used. In order to manufacture the display panel 50 provided with a bank, an additional mask is required to form the bank, and thus 10 mask processes using a total of 10 masks may be performed. However, in the case of the bankless structure such as this embodiment, nine masks and nine mask processes are required to manufacture the display panel 50, whereby the process is simplified, and the manufacturing cost is reduced.

It will be understood by those skilled in the art that the present disclosure can be embodied in other specific forms without changing the technical idea or essential characteristics of the present disclosure. Therefore, it should be understood that the embodiments described above are illustrative in all aspects and not restrictive. The scope of the present disclosure is characterized by the appended claims rather than the detailed description described above, and it should be construed that all alterations or modifications derived from the meaning and scope of the appended claims and the equivalents thereof fall within the scope of the present disclosure.

What is claimed is:

1. A display device comprising:
    a substrate on which a first pixel displaying a first color and a second pixel displaying a second color are placed, the second pixel placed adjacent the first pixel;
    a circuit element layer formed on the substrate and in which circuit elements are placed;
    a passivation layer placed on the circuit element layer;
    an overcoat layer formed on the passivation layer;
    a light absorption layer formed between the passivation layer and the overcoat layer in a non-emission area of the display device, the light absorption layer containing a colorant;
    an anode electrode of a light-emitting element formed in an emission area of the first pixel and an emission area of the second pixel;
    an emission layer of the light-emitting element covering the anode electrode and formed on the light absorption layer in the non-emission area; and
    a cathode electrode of the light-emitting element formed on the emission layer,
    wherein the overcoat layer is formed in an area except the emission area of the first pixel, and
    the first color is a white color.

2. The display device of claim 1, further comprising:
    a color filter formed on the passivation layer in the emission area of the second pixel.

3. The display device of claim 2, wherein the overcoat layer has a difference in level at an edge of the emission area of the first pixel.

4. The display device of claim 3, wherein the emission layer and the cathode electrode have a bending shape along the difference in level of the overcoat layer.

5. The display device of claim 4, wherein the cathode electrode controls a path of light emitted from the light-emitting element of the second pixel by using the bending shape.

6. The display device of claim 5, wherein the circuit element layer comprises:
    a first conductive layer formed on the substrate, the first conductive layer including a data line placed in the non-emission area, wherein the light that reflects off the cathode electrode is blocked from being emitted outside the display device by the first conductive layer in the non-emission area.

7. The display device of claim 2, wherein the first pixel and the second pixel each comprises:
the light-emitting element;
a switching transistor for applying a data voltage to a first node in response to a gate signal;
a storage capacitor connected to the first node, and storing the data voltage applied to the first node; and
a driving transistor controlling an amount of current applied to the light-emitting element in response to a voltage stored in the storage capacitor.

8. The display device of claim 7, wherein the circuit element layer comprises:
an active layer formed on the substrate, the active layer including a lower electrode of the storage capacitor;
a second conductive layer formed on the active layer, the second conductive layer including electrodes of the driving transistor and the switching transistor; and
a gate insulation layer interposed between the active layer and the second conductive layer,
wherein the anode electrode of the first pixel includes an extended part that overlaps the lower electrode of the storage capacitor and constitutes an upper electrode of the storage capacitor.

9. The display device of claim 8, wherein the upper electrode of the storage capacitor constitutes the emission area of the first pixel.

10. The display device of claim 8, wherein the passivation layer is interposed between the upper electrode and the lower electrode.

11. A display device comprising:
a substrate on which a pixel is placed, the substrate including an emission area and a non-emission area;
a circuit element layer placed on the substrate and in which one or more circuit elements are provided;
a passivation layer placed on the circuit element layer;
a light absorption layer placed on the passivation layer in the non-emission area, the light absorption layer containing a colorant;
an overcoat layer covering the light absorption layer;
an anode electrode placed on the overcoat layer;
an emission layer covering the anode electrode and formed on the light absorption layer in the non-emission area; and
a cathode electrode placed on the emission layer.

12. The display device of claim 11, wherein the circuit element layer comprises:
a first conductive layer placed on the substrate, the first conductive layer including a light-shielding layer and a lower electrode of a storage capacitor;
a buffer layer covering the first conductive layer;
an active layer placed on the buffer layer;
a gate insulation layer covering the active layer; and
a second conductive layer placed on the gate insulation layer, the second conductive layer including electrodes of at least one transistor.

13. The display device of claim 12, wherein the storage capacitor further comprises an upper electrode placed at the second conductive layer and having at least a region covering the lower electrode.

14. The display device of claim 13, wherein the anode electrode is connected to the upper electrode of the storage capacitor through a first via hole.

15. The display device of claim 14, wherein the light absorption layer is constructed as a single absorption layer containing a colorant in a blue color in a region surrounding the first via hole.

16. The display device of claim 15, further comprising:
a color filter placed on the passivation layer in the emission area, the color filter made of a same material as the light absorption layer.

17. The display device of claim 15, wherein the first via hole includes a passivation hole penetrating through the passivation layer, an opening formed in the light absorption layer, and an opening formed in the overcoat layer.

18. The display device of claim 17, wherein a side of the opening penetrating through the light absorption layer and a side of the opening formed in the overcoat layer have a positive taper shape.

19. The display device of claim 17, wherein a region around the opening formed in the light absorption layer is not covered by the overcoat layer.

20. The display device of claim 17, wherein a region around the passivation hole is not covered by the light absorption layer and the overcoat layer.

* * * * *